(12) United States Patent
Zluc et al.

(10) Patent No.: US 11,682,661 B2
(45) Date of Patent: Jun. 20, 2023

(54) HERMETIC OPTICAL COMPONENT PACKAGE HAVING ORGANIC PORTION AND INORGANIC PORTION

(71) Applicant: AT&S Austria Technologie & Systemtechnik Aktiengesellschaft, Leoben (AT)

(72) Inventors: Andreas Zluc, Leoben (AT); Johannes Stahr, Gassing (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/929,340

(22) Filed: Apr. 27, 2020

(65) Prior Publication Data

US 2020/0365573 A1 Nov. 19, 2020

(30) Foreign Application Priority Data

May 13, 2019 (EP) ..................................... 19174140

(51) Int. Cl.
*H01L 25/16* (2023.01)
*H01L 31/0203* (2014.01)
(Continued)

(52) U.S. Cl.
CPC .......... *H01L 25/165* (2013.01); *H01L 25/167* (2013.01); *H01L 31/0203* (2013.01);
(Continued)

(58) Field of Classification Search
CPC . H01L 25/165; H01L 25/167; H01L 31/0203; H01L 31/02325; H01L 31/18; H01L 33/005; H01L 33/486; H01L 33/58; H01L 33/60; H01L 2224/131; H01L 2933/0033; H01L 2924/16195; H01L 2924/16251; H01L 2224/16238; H01L 2924/16152; H01L 2224/16235;
(Continued)

(56) References Cited

U.S. PATENT DOCUMENTS 5,837,356 A * 11/1998 Katori .................... H05K 1/095
428/210
6,426,146 B1 * 7/2002 Ameen .................... C23C 26/00
205/197
(Continued)

FOREIGN PATENT DOCUMENTS

CN 108598246 A 9/2018
EP 1 157 967 A2 11/2001
(Continued)

OTHER PUBLICATIONS

Extended European Search Report in Application No. 19174140.4; dated Nov. 5, 2019; pp. 1-7; European Patent Office, 80298, Munich, Germany.

*Primary Examiner* — Duy T Nguyen
(74) *Attorney, Agent, or Firm* — Robert A. Blaha; Smith Tempel Blaha LLC

(57) ABSTRACT

A hermetic package includes a base body, wherein dielectric material of a bottom of the base body is made of an organic material, an optical component mounted on the base body, and inorganic material hermetically enclosing the optical component along all surrounding sides.

13 Claims, 15 Drawing Sheets

(51) Int. Cl.
   *H01L 31/0232* (2014.01)
   *H01L 31/18* (2006.01)
   *H01L 33/48* (2010.01)
   *H01L 33/58* (2010.01)
   *H01L 33/60* (2010.01)
   *H01L 33/00* (2010.01)

(52) U.S. Cl.
   CPC ........ *H01L 31/02325* (2013.01); *H01L 31/18* (2013.01); *H01L 33/005* (2013.01); *H01L 33/486* (2013.01); *H01L 33/58* (2013.01); *H01L 33/60* (2013.01)

(58) Field of Classification Search
   CPC ........... H01L 2924/15153; H01L 23/10; B81C 2203/0109; B81C 2203/037; B81C 1/00317; B81B 2201/047; H05K 1/185; H05K 1/0313; H05K 1/0306; H05K 3/30; H05K 1/0201; H05K 2201/09136; H05K 2201/06
   USPC .......................................... 257/98
   See application file for complete search history.

(56) References Cited

U.S. PATENT DOCUMENTS

| | | |
|---|---|---|
| 6,603,182 B1 | 8/2003 | Low et al. |
| 2004/0264884 A1 | 12/2004 | Liu |
| 2006/0002099 A1 | 1/2006 | Stoneham et al. |
| 2007/0013082 A1* | 1/2007 | Shiraishi ................. H01L 24/97 257/777 |
| 2008/0198552 A1* | 8/2008 | Cho ........................ H01L 24/49 216/13 |
| 2010/0176468 A1* | 7/2010 | Ishii .................... B81C 1/00269 174/251 |
| 2013/0240262 A1* | 9/2013 | Nagahiro ............ C22C 32/0031 174/565 |
| 2015/0014711 A1* | 1/2015 | Bergenek ................ H01L 33/56 257/88 |
| 2015/0130326 A1* | 5/2015 | Ishigami ............... H05K 3/4046 310/348 |
| 2015/0291415 A1 | 10/2015 | Haney et al. |
| 2018/0069163 A1 | 3/2018 | Clark et al. |
| 2020/0127178 A1* | 4/2020 | Kapusta ................ H01L 33/648 |

FOREIGN PATENT DOCUMENTS

| | | |
|---|---|---|
| JP | 2011049253 A | 3/2011 |
| JP | 2012159935 A | 8/2012 |
| KR | 101077410 | * 10/2011 |
| WO | 2018151915 A1 | 8/2018 |

* cited by examiner

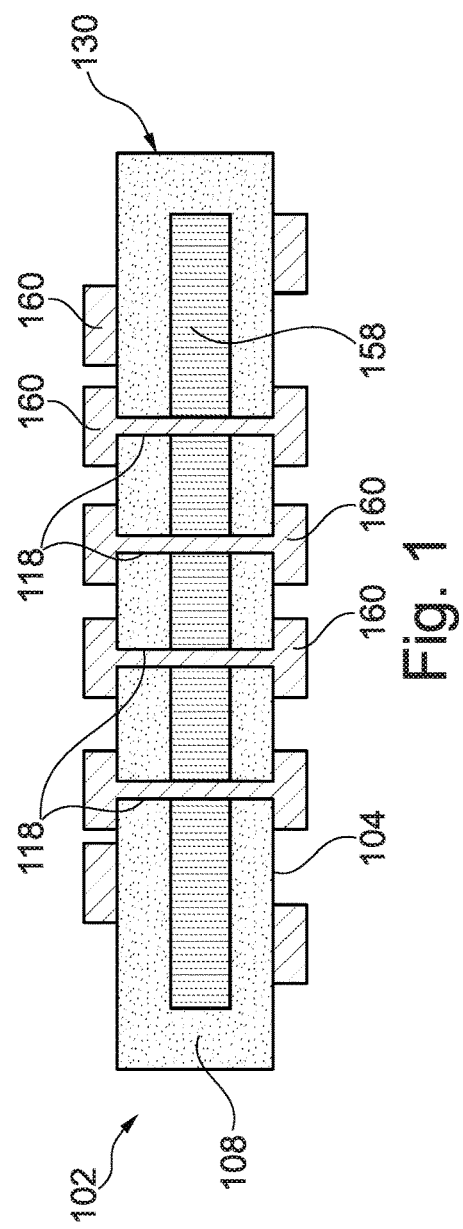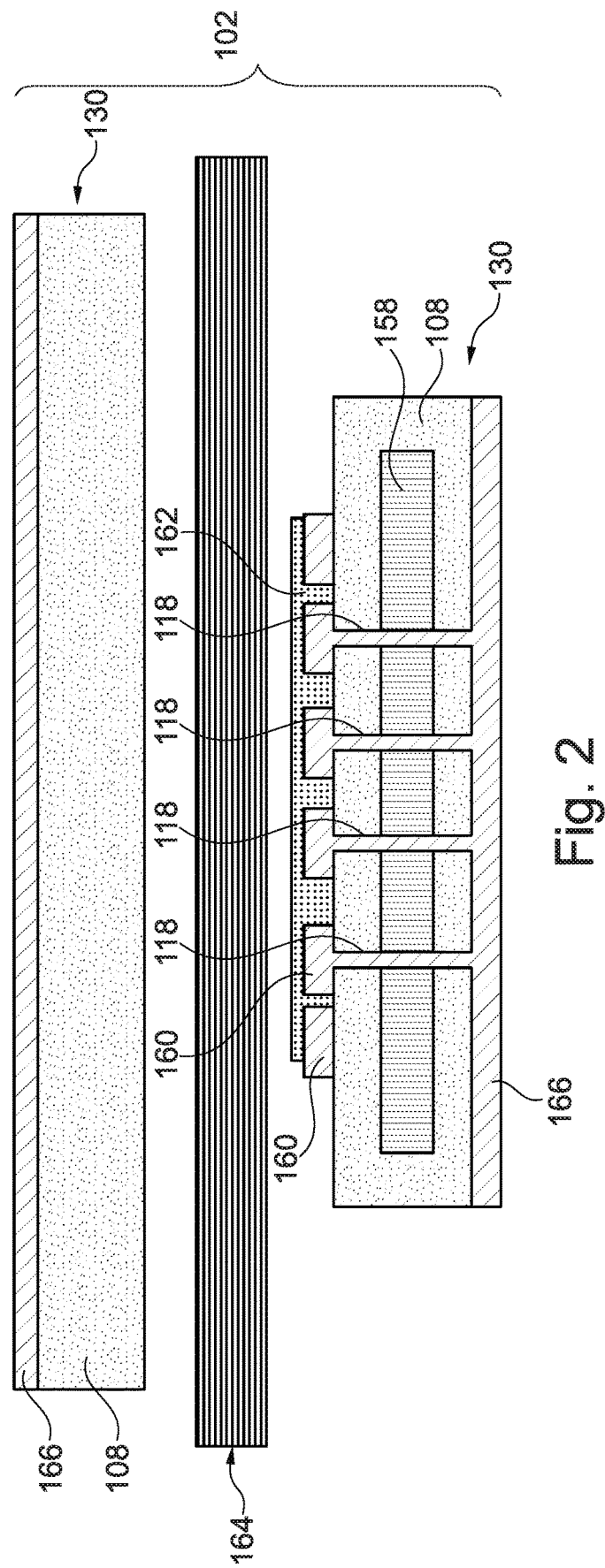

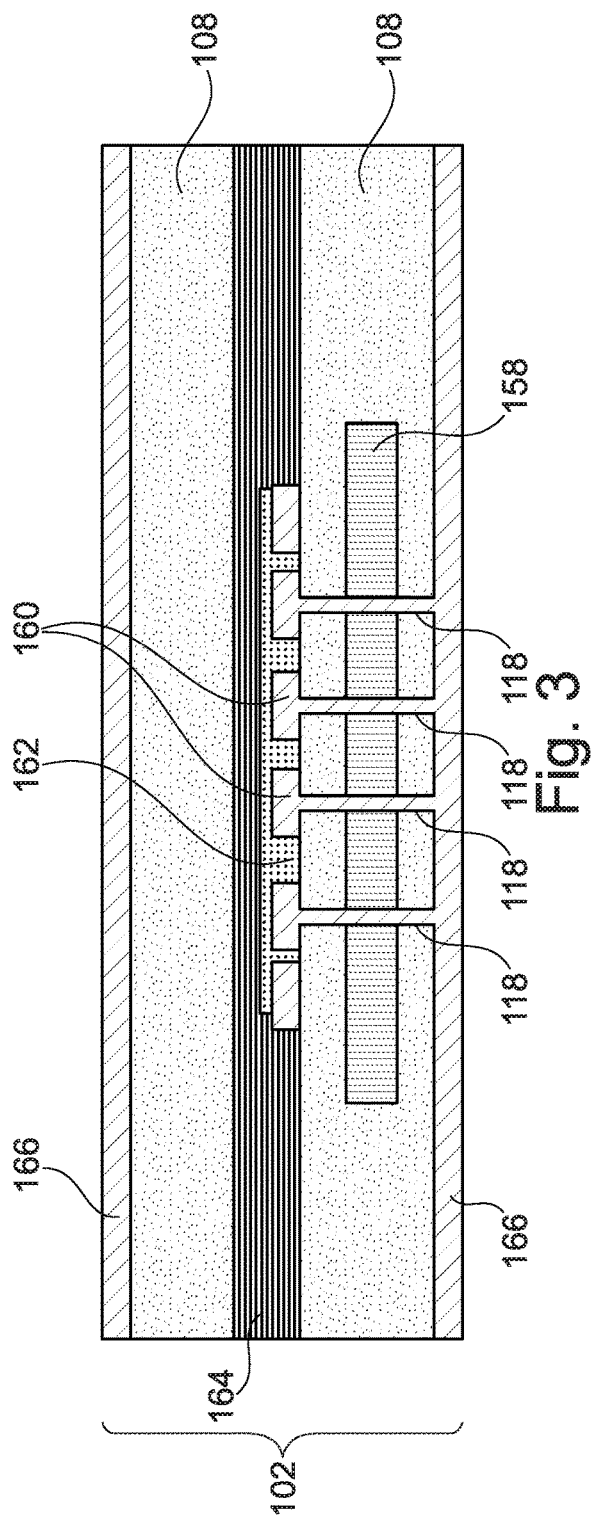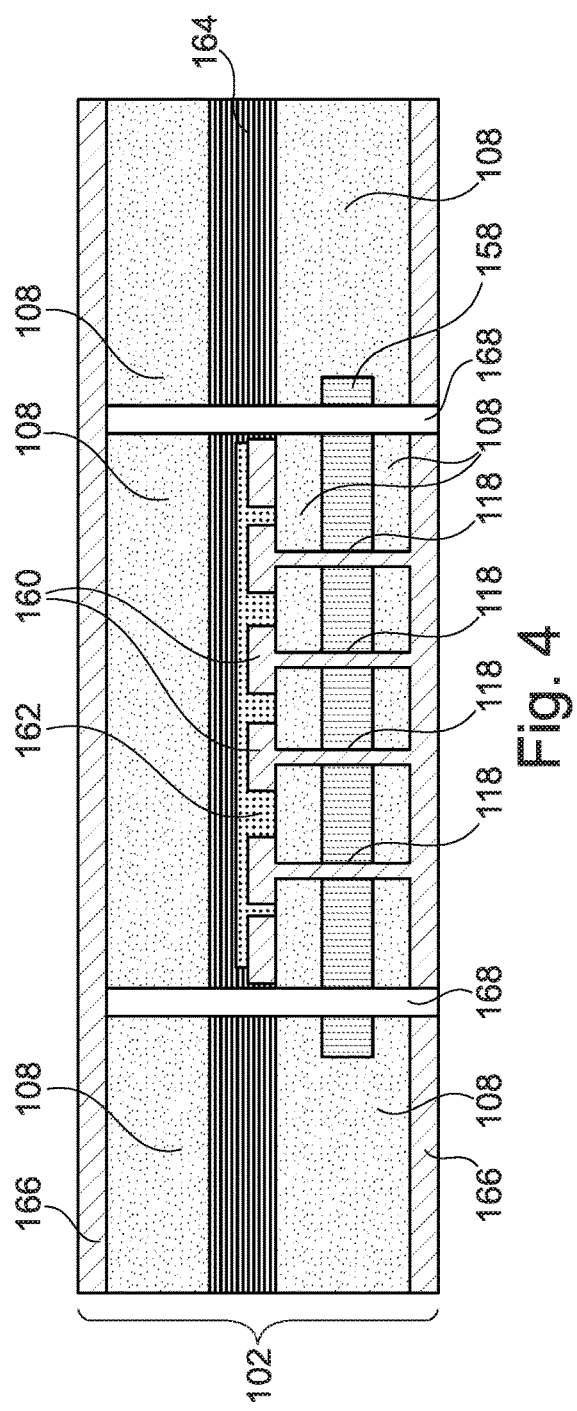

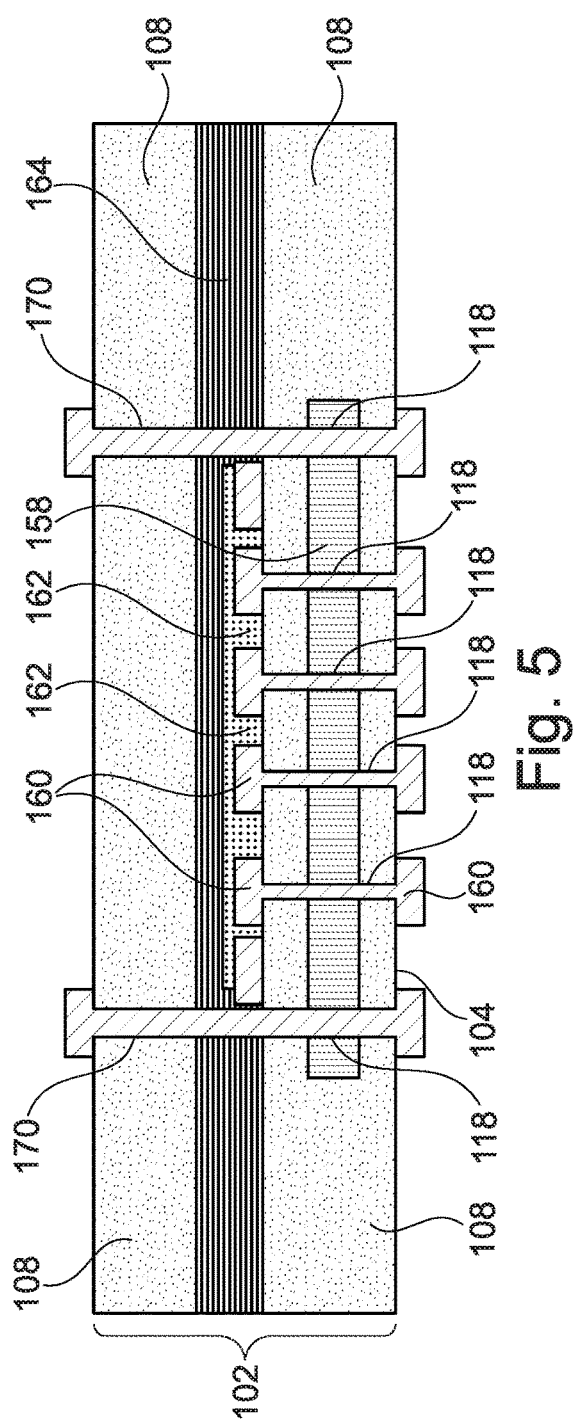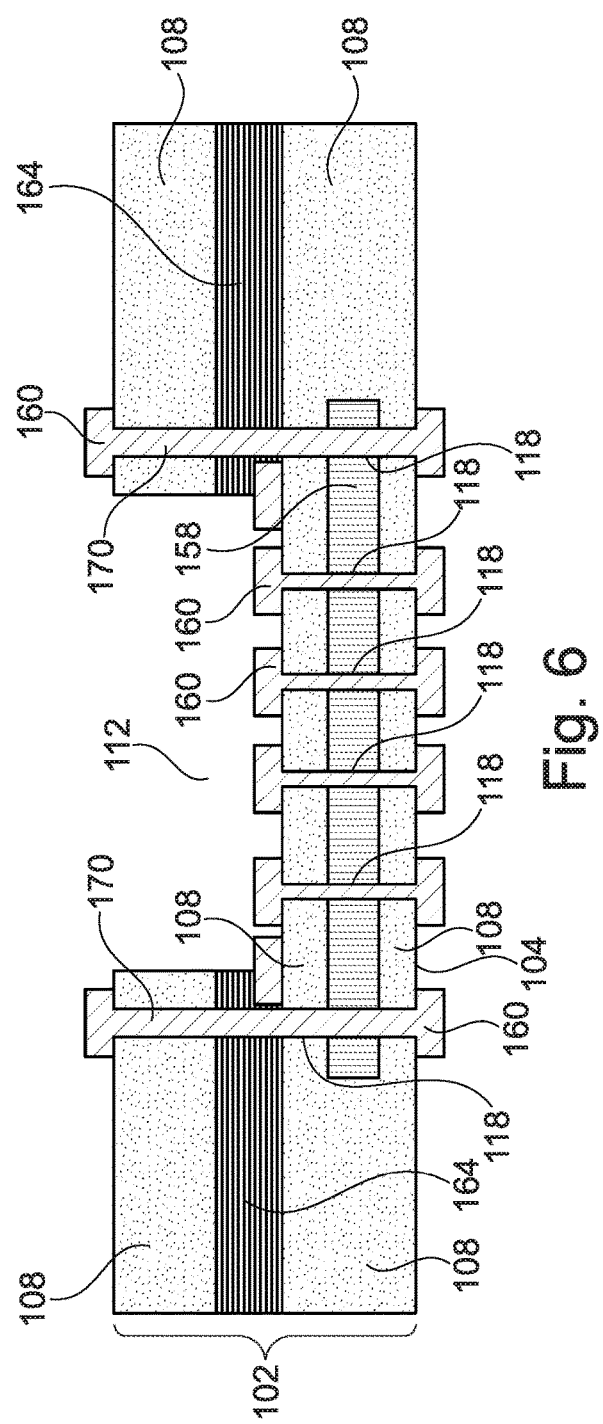
Fig. 5
Fig. 6

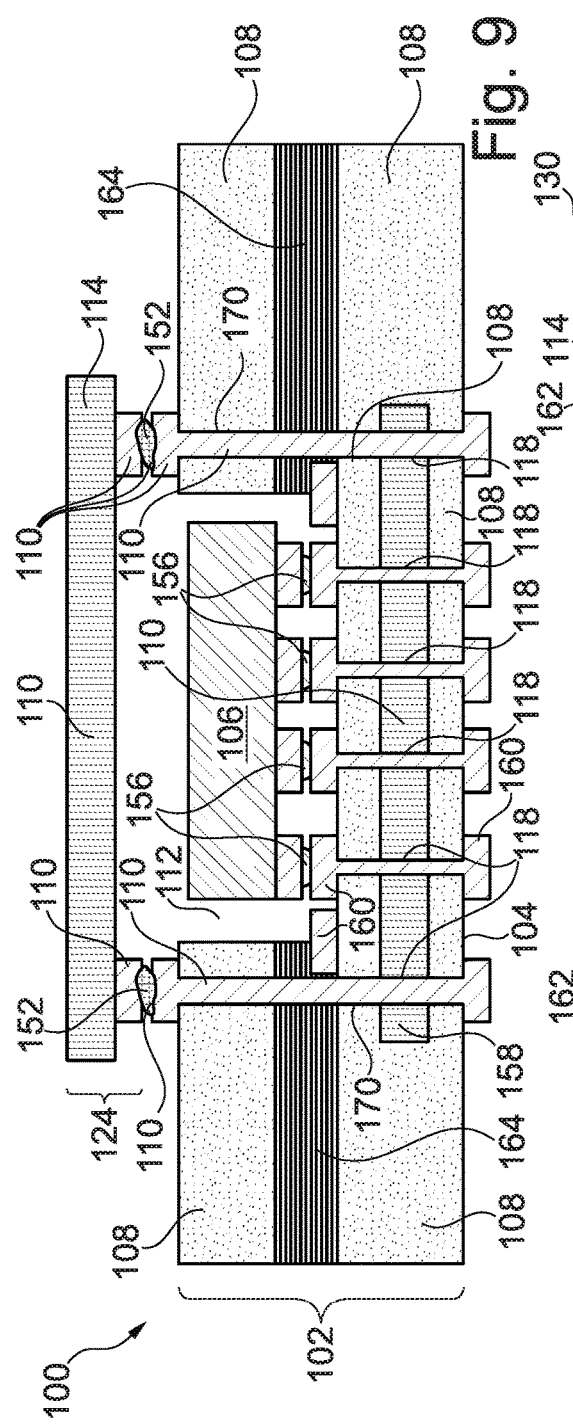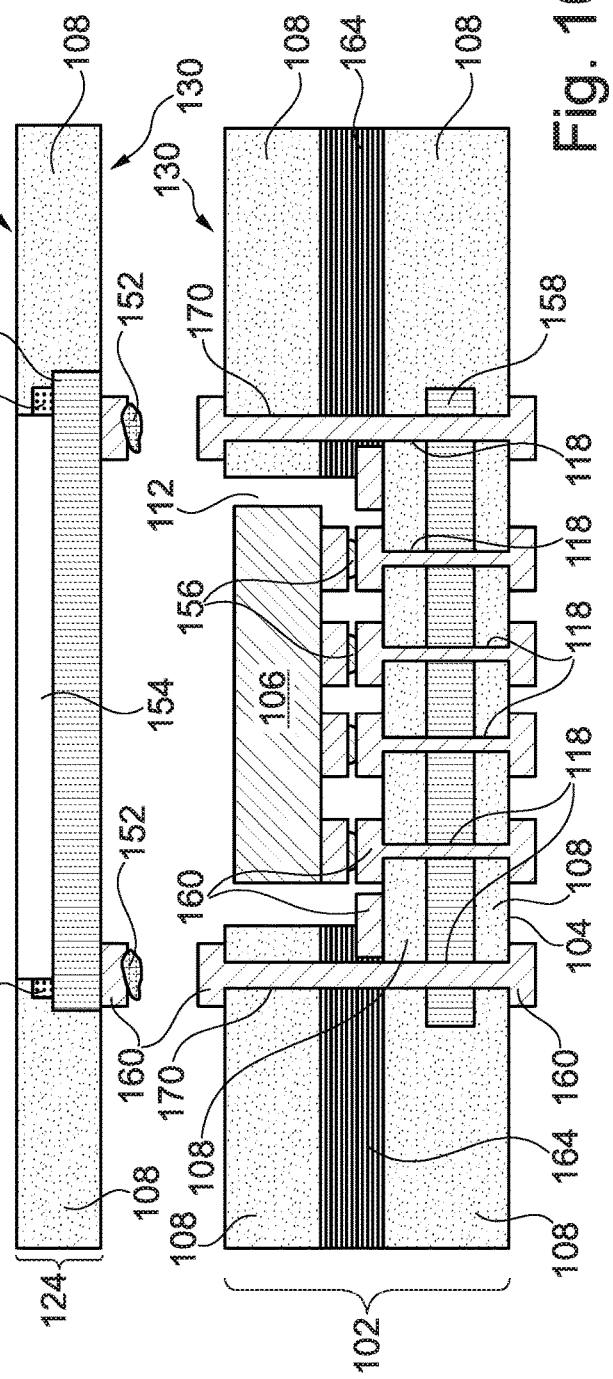

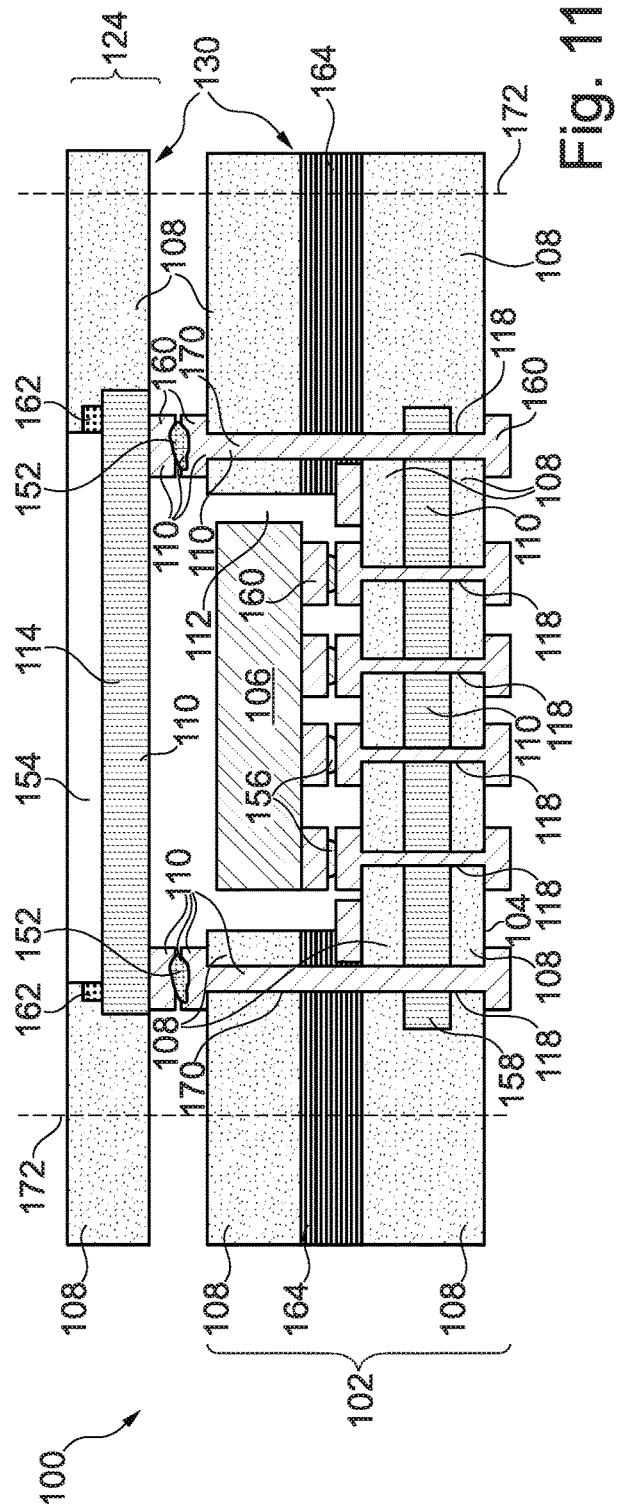
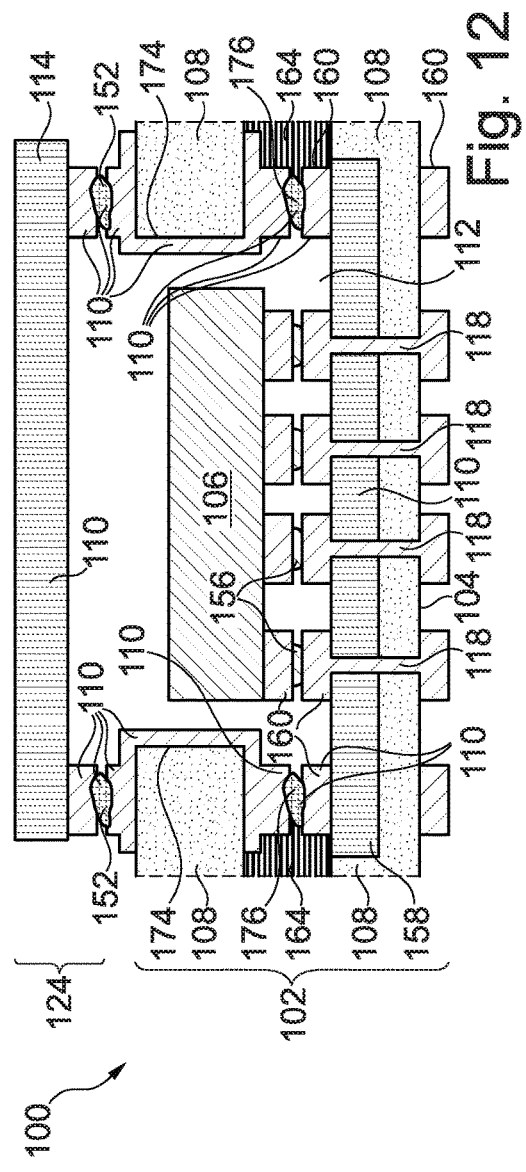

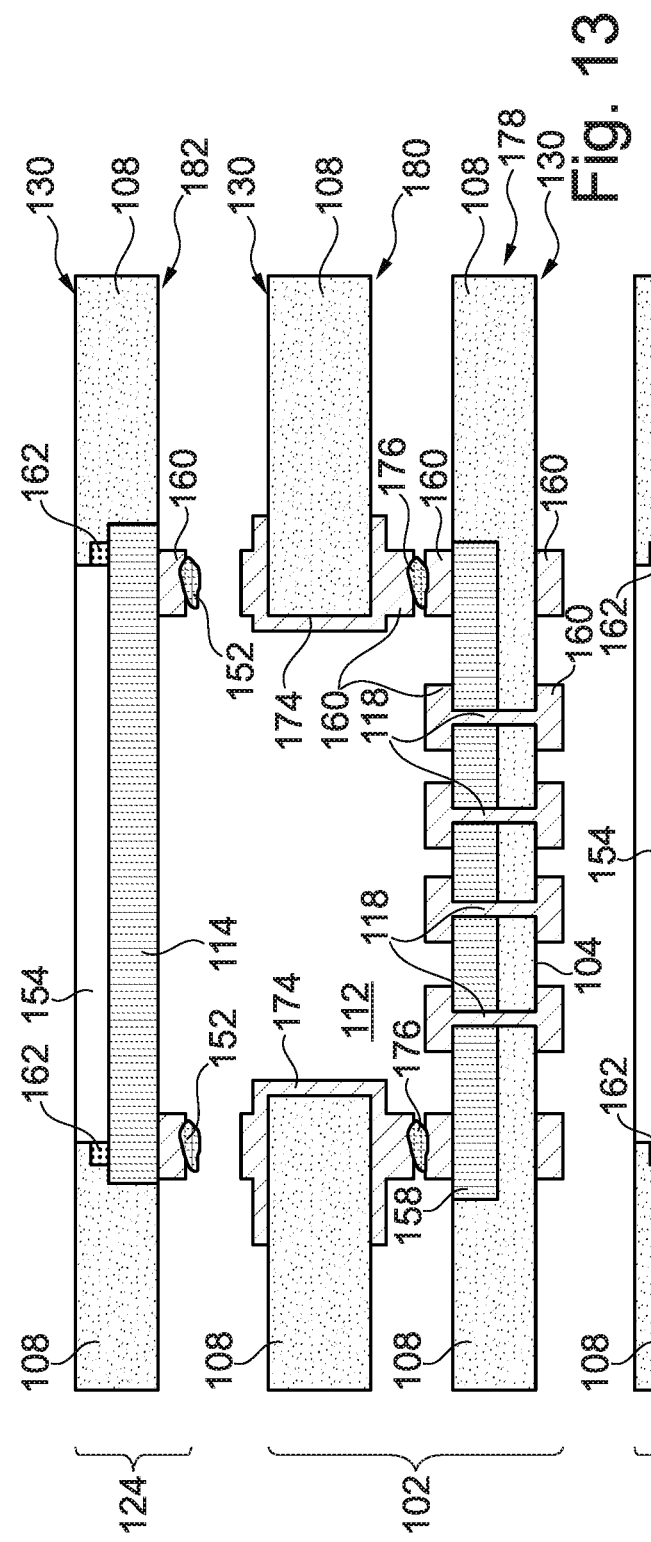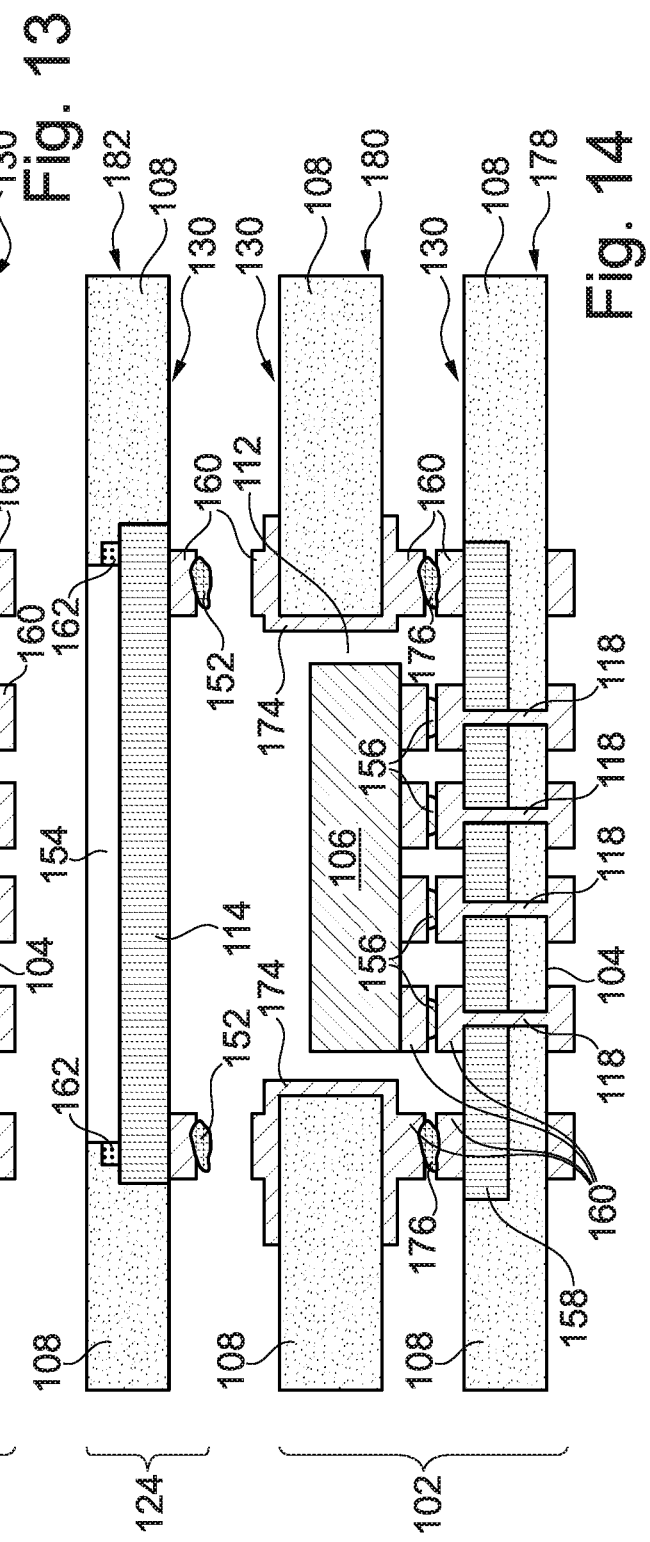

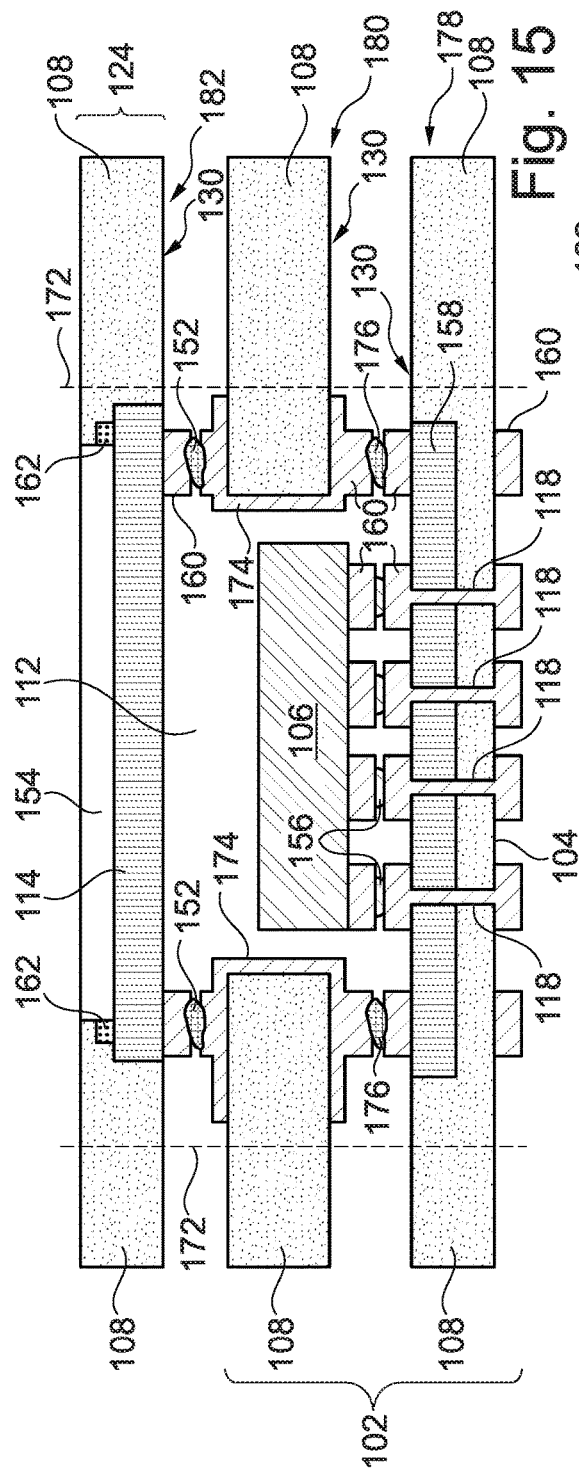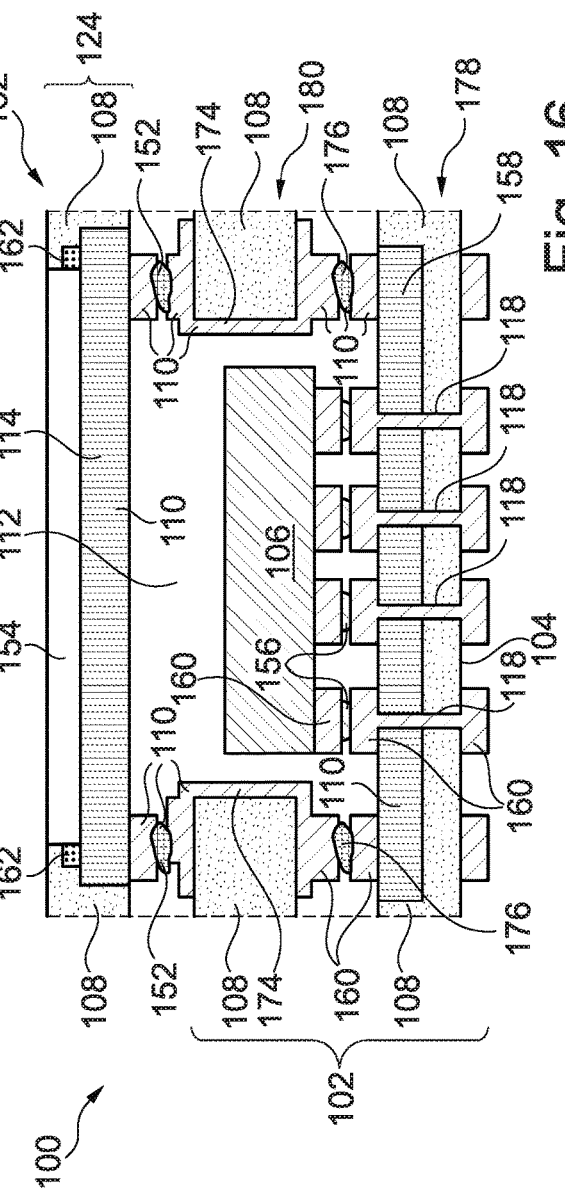

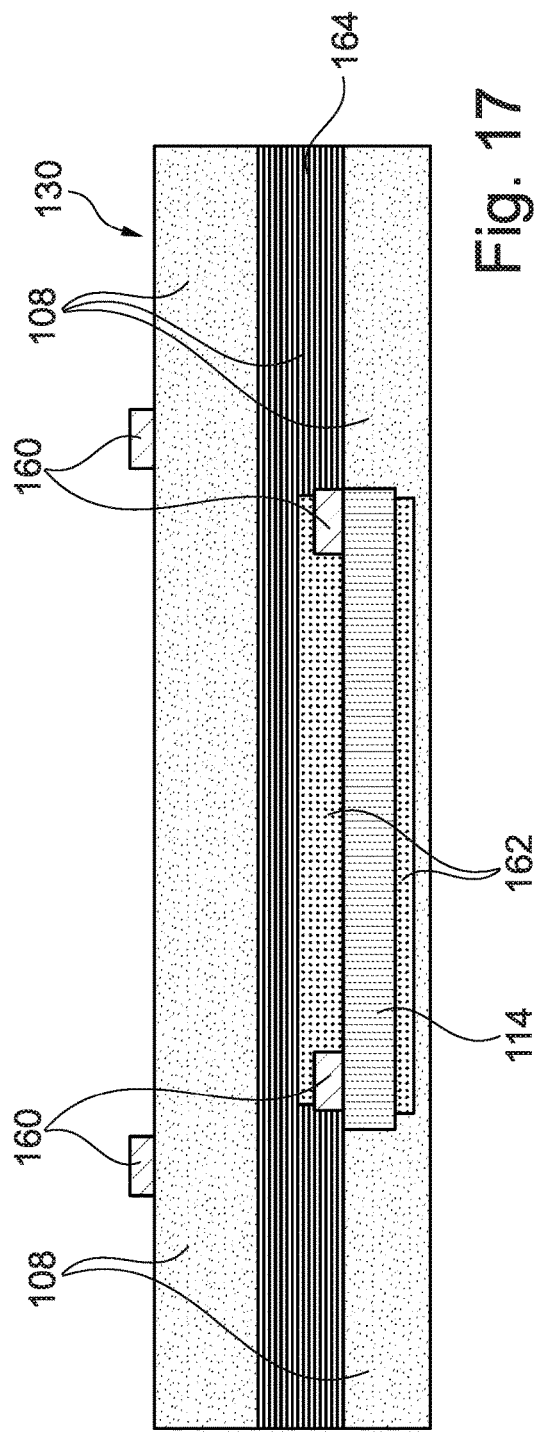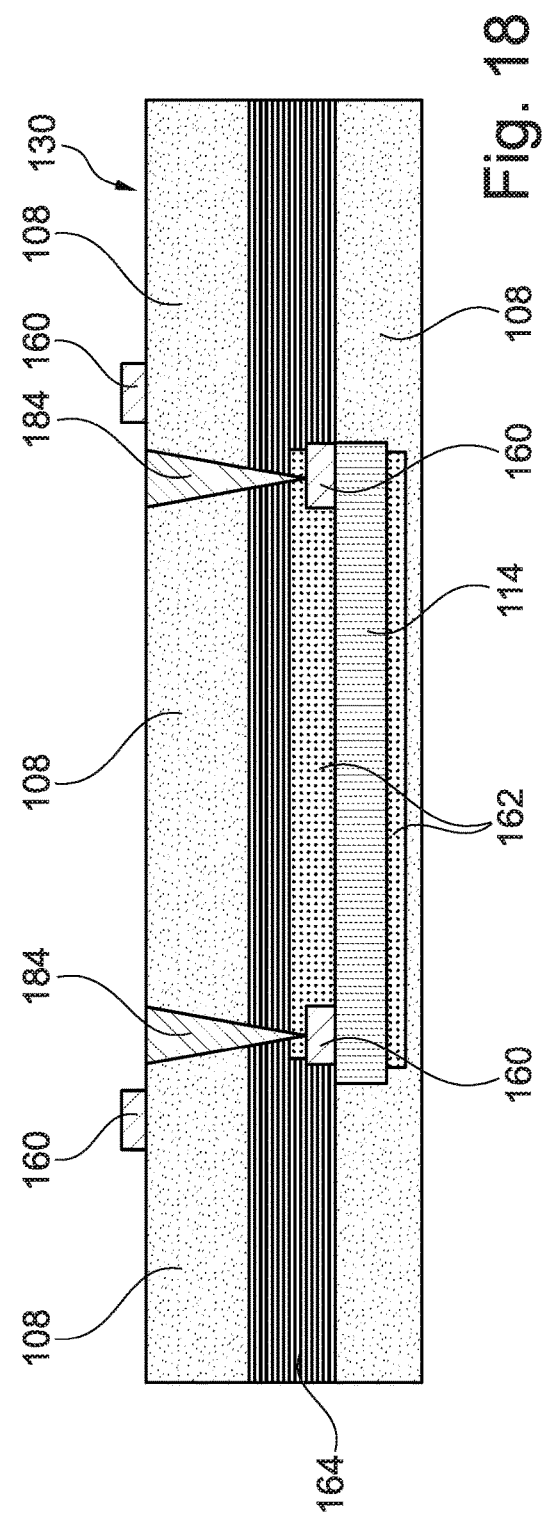

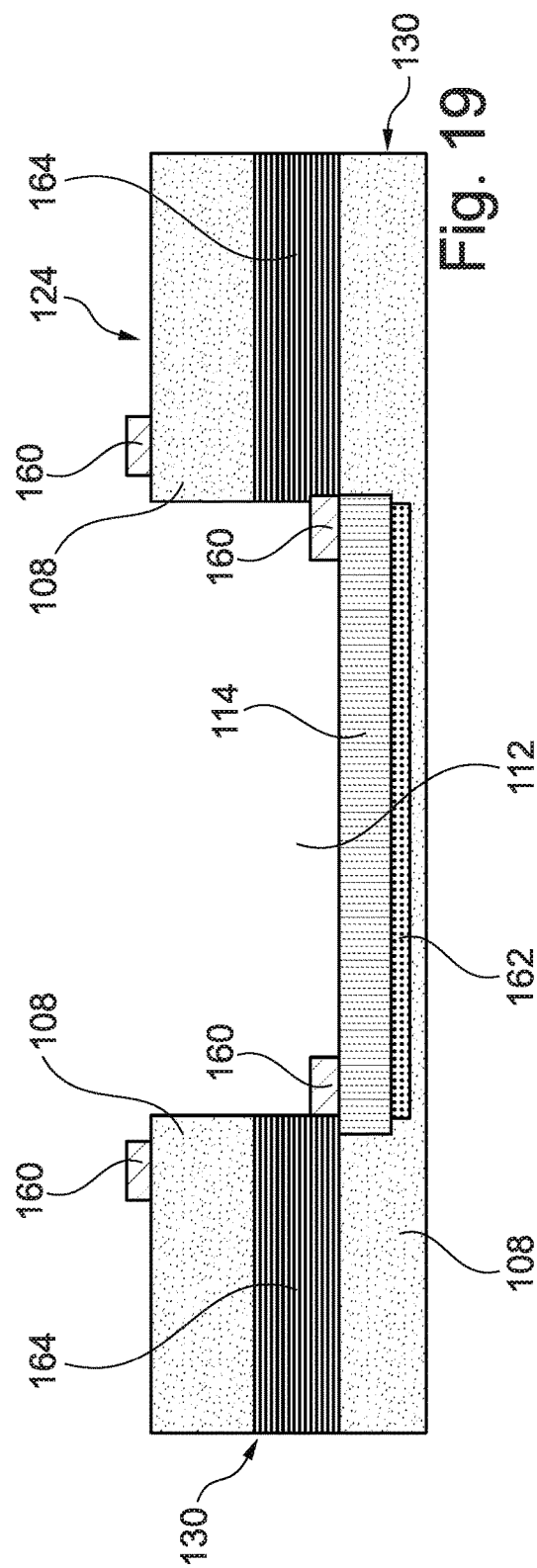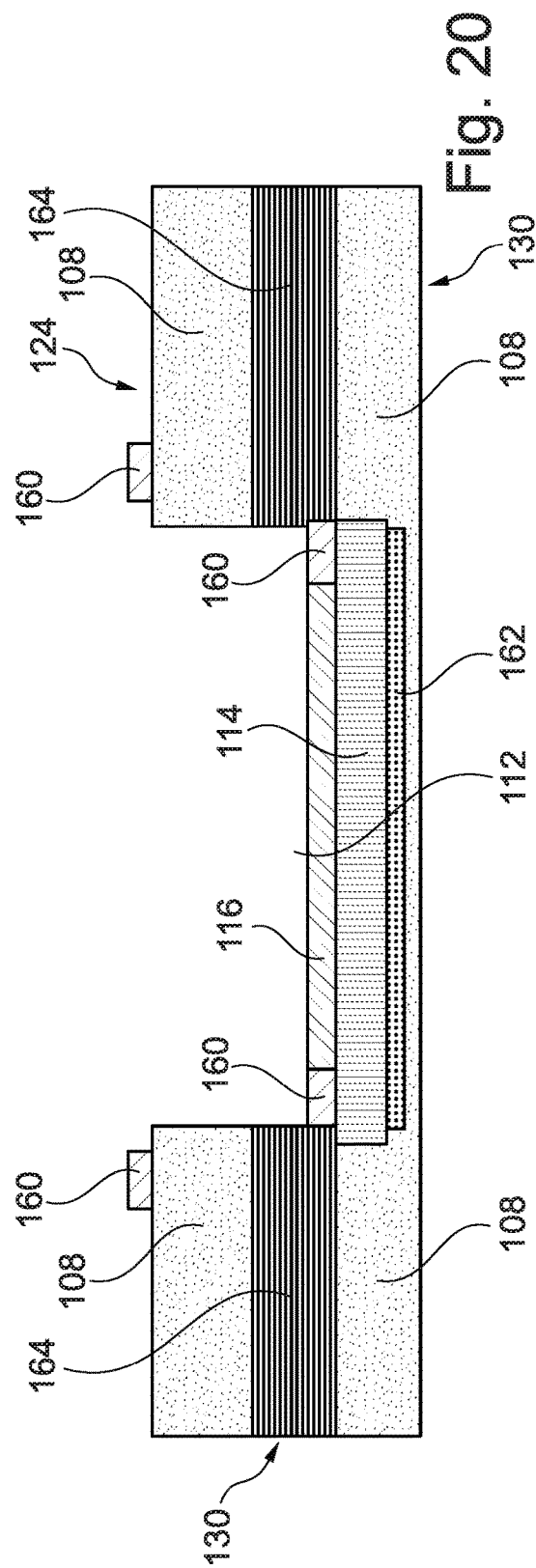

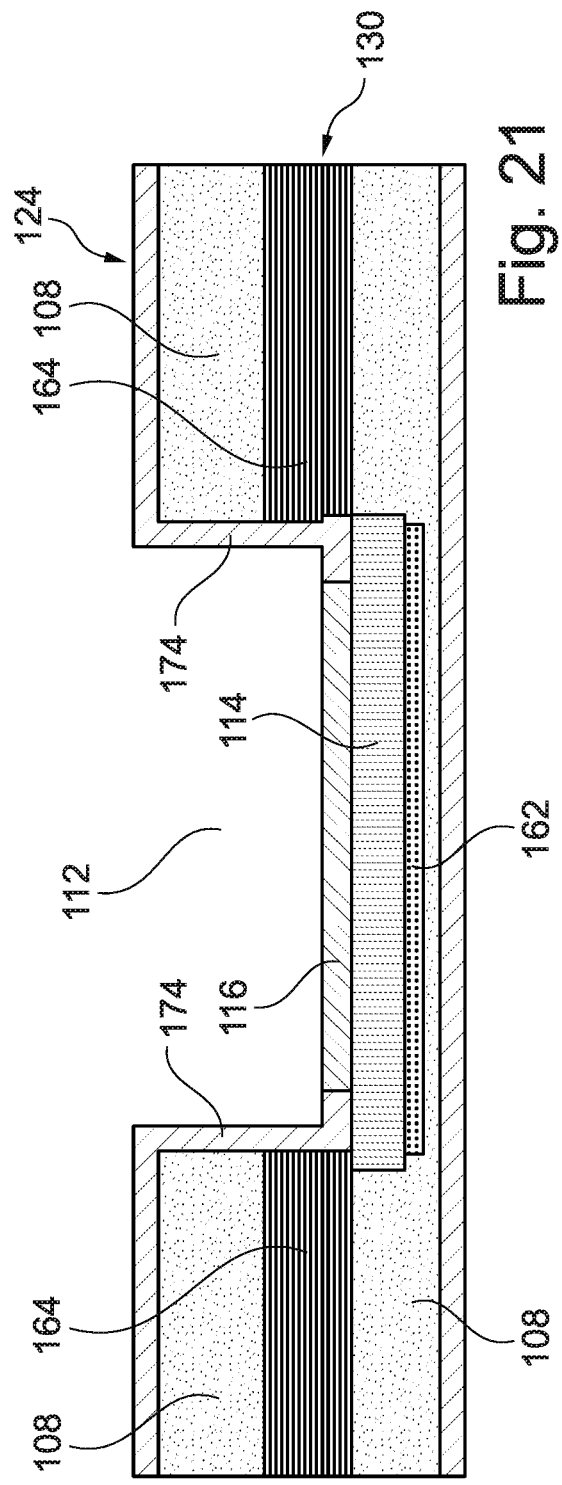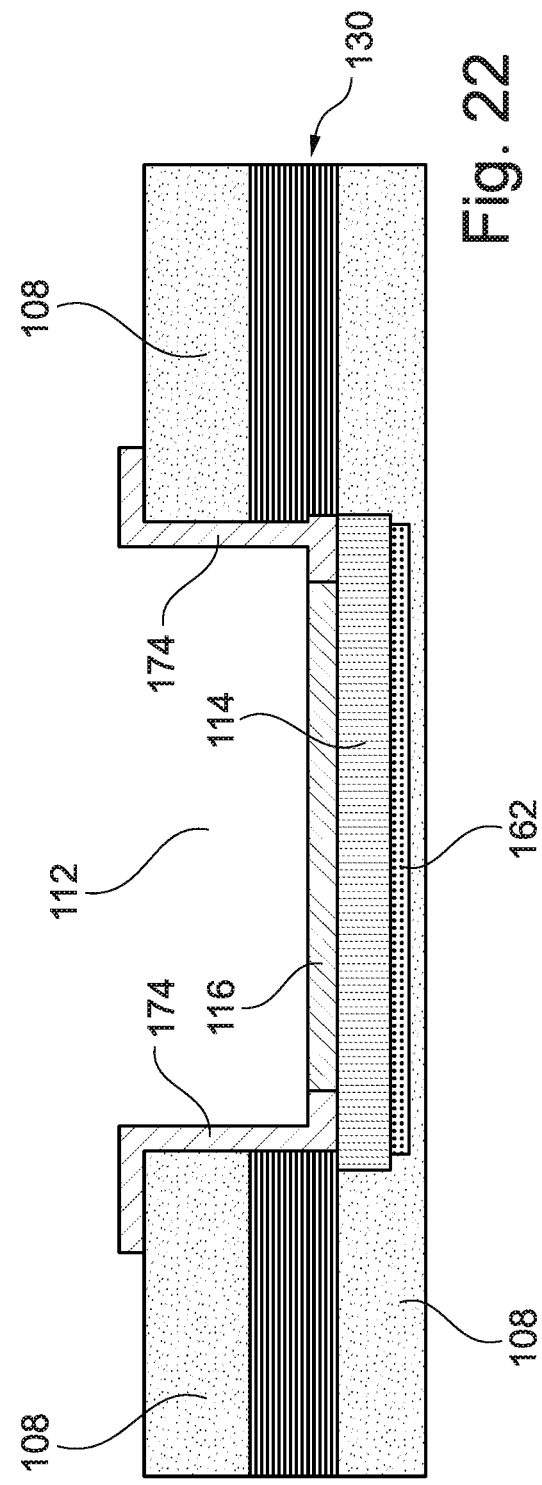

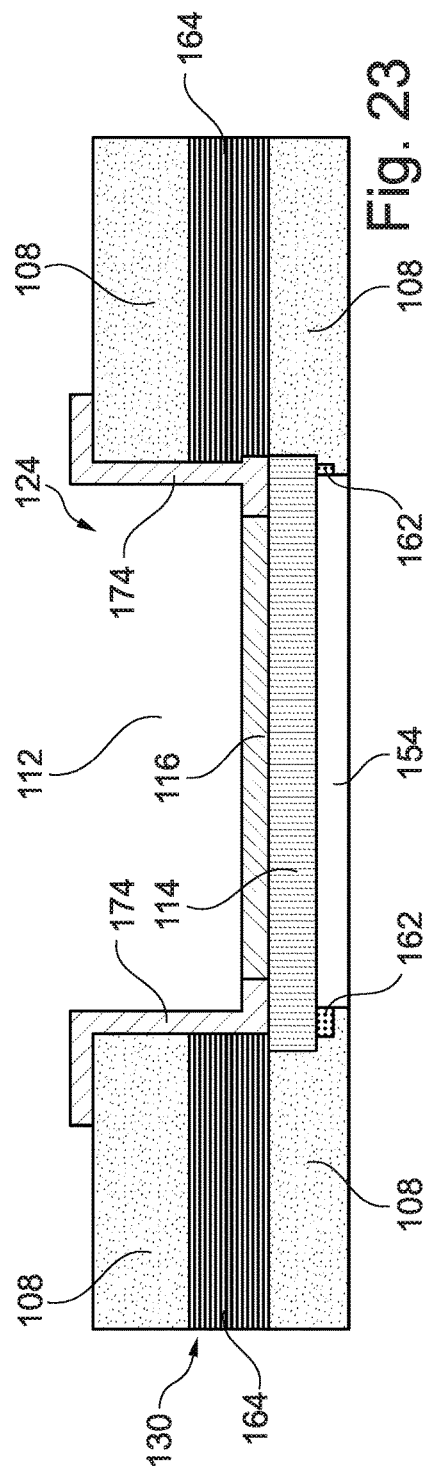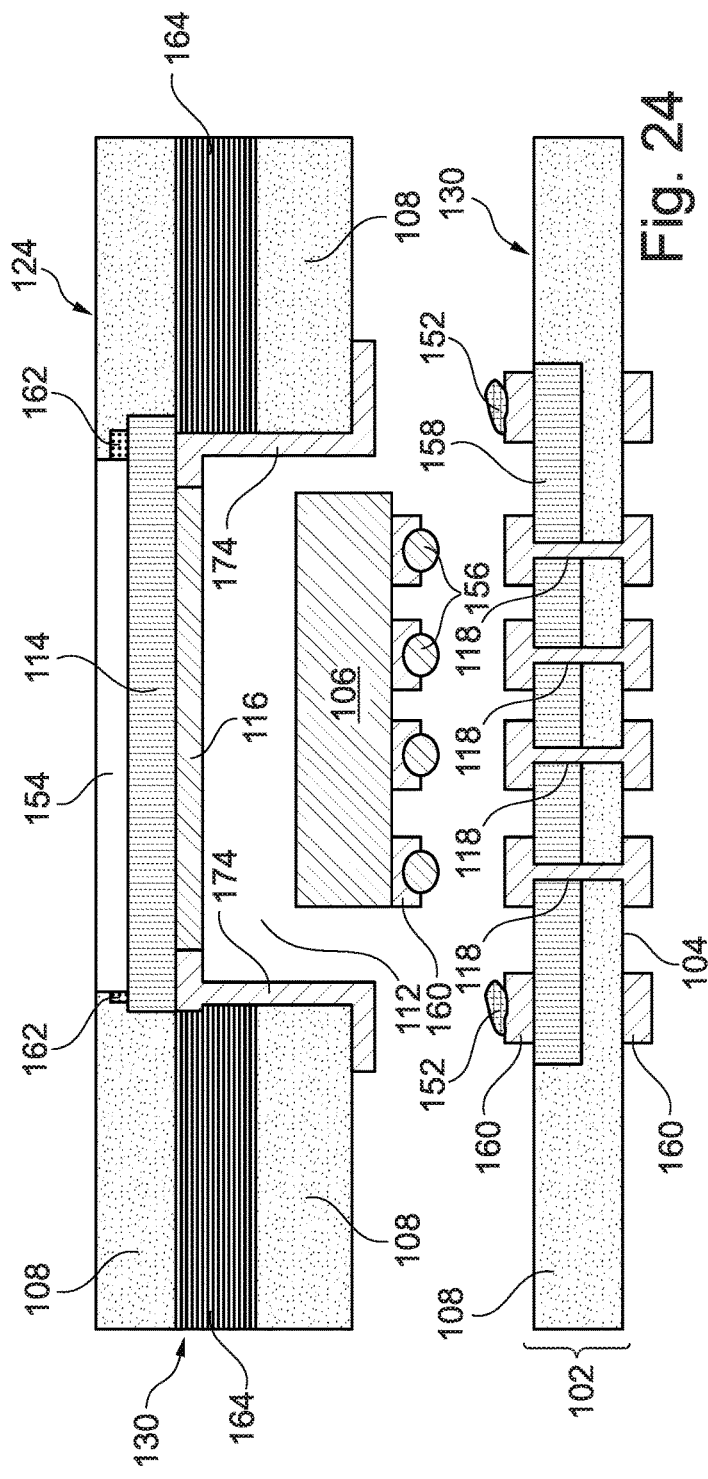

HERMETIC OPTICAL COMPONENT PACKAGE HAVING ORGANIC PORTION AND INORGANIC PORTION

CROSS-REFERENCE TO RELATED APPLICATION

This application claims the benefit of the filing date of the European Patent Application No. 19 174 140.4, filed May 13, 2019, the disclosure of which is hereby incorporated herein by reference.

TECHNICAL FIELD

Embodiments of the invention relate to a method of manufacturing a hermetic package, and to a hermetic package.

TECHNOLOGICAL BACKGROUND

In the context of growing product functionalities of component carriers equipped with one or more electronic components and increasing miniaturization of such components as well as a rising number of components to be mounted on or embedded in the component carriers such as printed-circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

In particular, efficiently embedding an optical component is an issue.

SUMMARY

There may be a need to efficiently embed an optical component.

According to an exemplary embodiment of the invention, a hermetic package is provided which comprises a base body, wherein dielectric material of a bottom of the base body is made of an organic material, an optical component mounted on the base body, and inorganic material hermetically enclosing the optical component along all surrounding sides.

According to another exemplary embodiment of the invention, a method of manufacturing a hermetic package is provided, wherein the method comprises providing a base body with a bottom having dielectric material being made of organic material, mounting an optical component on the base body, and hermetically surrounding the optical component with inorganic material around all sides.

OVERVIEW OF EMBODIMENTS

In the context of the present application, the term "hermetic package" may particularly denote a circumferentially fully encapsulated optical component which, in view of the complete circumferential enclosure by encapsulant material, is entirely physically decoupled from an environment of the package. This hermetic sealing may be accomplished by inorganic material. The hermetic surrounding may be of different kinds in different embodiments. For instance, the optical component may be hermetically sealed against gas such as oxygen, may be hermetically sealed against humidity, and/or may be hermetically sealed against dirt or dust. For accomplishing an oxygen tight or air-tight hermetic sealing, constituents (for instance a base body and a cap body) of the package material surrounding the optical component may be connected by soldering (in particular diffusion soldering, glass soldering, laser soldering), sintering, ultrasonic welding, or gluing. A connection of a base body and a cap body may be accomplished also for instance by thermal-compression bonding. For accomplishing a humidity-tight hermetic surrounding, such a connection may be accomplished by soldering, sintering or welding. For obtaining a hermetic surrounding disabling also degassing of connection material or releasing organic material, soldering (in particular diffusion soldering or glass soldering), or welding (in particular laser welding or ultrasound welding) may be used.

In the context of the present application, the term "organic material" may particularly denote a material relating to at least one organic compound. Such an organic compound may be any chemical compound that contains carbon, in particular carbon-hydrogen (C—H) bonds. In particular, such organic material may comprise a resin such as an epoxy resin.

In the context of the present application, the term "inorganic material" may particularly denote a material relating to at least one inorganic compound. An inorganic compound may be a chemical compound that lacks carbon-hydrogen (C—H) bonds, or entirely lacks carbon.

In the context of the present application, the term "optical component" may particularly denote an inlay-type member to be arranged in an interior of the package and having an optical function. For instance, such an optical component may be capable of emitting and/or detecting electromagnetic radiation, such as visible light, infrared radiation, ultraviolet light, etc.

In the context of the present application, the term "enclosing along all surrounding sides" may particularly denote the fact that the inorganic material may enclose the optical component in all spatial directions (in particular left and right, at front and back, at top and bottom sides). Thus, it is possible that there is no physical access from an exterior of the package up to the optical component without passing through inorganic material. However, the hermetic enclosure may keep the optical communication between the hermetically surrounded optical component and the surrounding of the package intact by enabling propagation of electromagnetic radiation such as light between the optical component and the exterior of the package.

According to an exemplary embodiment of the invention, a package is provided having an encapsulated or housed at least one optical component which is fully circumferentially surrounded by inorganic material so as to be hermetically accommodated within the package. Advantageously, the package may be created based on organic material, such as dielectric PCB (printed-circuit board) material, which is then synergistically combined with inorganic material for accomplishing the hermetic accommodation of the optical component. In particular, organic material may be used for forming at least part of a bottom of a base body on which the component is mounted. Hence, it is possible to construct the hermetic package as a heterogeneous system by combining materials which can be assembled in a way to enable a reduction in complexity of production compared to a homogeneous system of, for instance pure inorganic materials or pure organic materials. By using organic (for example FR4-based) materials acting as a mechanical carrier during production, inorganic material (for example a glass and metal construction) may be used for completing the hermetic package. Thus, an exemplary embodiment synergistically combines organic material (descriptively speaking serving as carrier material) and inorganic material (descriptively speaking serving as hermetic surrounding material) to form a hermetic package hermetically sealing at least one optical component.

More specifically, using an organic material, such as an FR4 carrier, may enable parallelization of manufacturing of only partially inorganic packages on panel level. Such a processed panel may then be separated into separate hermetic packages to reduce stress and warpage out of CTE (coefficient of thermal expansion) mismatch of inorganic materials and metals. Furthermore, the organic carrier can be used for the additional function of mounting and embedding components which are highly advantageous in the proximity of the packaged component in the hermetic construction. According to a manufacturing architecture of an exemplary embodiment of the invention, an organic package may thus be converted into a partially inorganic package. This may involve metallization of the organic material. From its outside design, the hermetic package may appear as an organic package, with inorganic package constituents in the inside.

In the following, further exemplary embodiments of the manufacturing method and the hermetic package will be explained.

In an embodiment, the optical component is accommodated in a hollow cavity. For instance, the cavity may be delimited—only partially or entirely—by the inorganic material. Locating the component in a cavity may surround the component with a defined gaseous or vacuum atmosphere. This may be advantageous in terms of heat removal and may also allow the optical components to cooperate with further optical elements (such as a reflection surface, a lens, etc.) which may be arranged in the cavity as well.

Alternatively, said cavity may be delimited partially or entirely by the organic material. In such an embodiment, the inorganic material forming the complete hermetic surrounding of the optical component may be located outside of at least part of the organic material.

In an embodiment, the inorganic material is composed of at least one metal (for instance copper), glass and/or ceramic. Copper, being highly compatible with organic materials such as component-carrier material, may be used for establishing electrically-conductive connections of the optical component. Glass may be used for forming one or more optically-transparent windows optically coupling the optical component with an environment of the hermetic package. The ceramic material may for instance have excellent properties in terms of thermal conductivity, so as to significantly contribute to heat removal during operation. Furthermore, the ceramic material may provide an electric insulation.

In an embodiment, the organic material comprises resin, in particular prepreg or FR4 resin. For example, such a resin may be an epoxy resin. By using prepreg or FR4 resin, the hermetic package may be formed on the basis of PCB materials.

In an embodiment, the organic material surrounds the optical component at least partially along at least five sides, i.e. along five sides or along all six sides. Hence, the organic material may for instance partially or entirely surround the optical component, whereas the inorganic material may entirely surround the optical component.

In an embodiment, the optical component comprises at least one of the group consisting of a light-emitting diode, a laser diode, and a photodiode. Thus, the optical component may be a light-emitting optical component configured for emitting light, such as visible light, infrared radiation and/or ultraviolet radiation. However, the optical component may also be a light-detecting element, such as a photodiode, or an array of photosensitive elements, such as a CCD detector or a CMOS detector.

In an embodiment, the inorganic material forms an inorganic area delimiting a cavity with an organic surrounding. Thus, it may be possible to combine the hermetic sealing capability of the inorganic material with the simple processing properties of organic (in particular PCB) material.

In an embodiment, the package comprises an optically-transparent member, in particular a glass body, through which light can propagate between the optical component and an environment of the hermetic package. Thus, notwithstanding the hermetic sealing, it may be nevertheless possible to provide an optical coupling between an interior and an exterior of the hermetic package by the optically-transparent member.

In an embodiment, the optically-transparent member comprises a lens. By such a lens, light can be focused from an exterior of the package onto a light-sensitive surface of the optical component. Such a lens may also be capable of bundling diverging light emitted from the optical component into a for instance parallel bundle of light propagating to an exterior of the package.

In an embodiment, the optically-transparent member is at least partially embedded in the organic material. For example, the optically-transparent member may be embedded in organic material such as FR4 or prepreg. For accomplishing this embedding procedure, properly developed PCB procedures may be used in a simple way.

In an embodiment, at least part of a surface of the optically-transparent member is coated with a protection varnish. Such a protection varnish may suppress undesired deposition of metallic material during a plating procedure on the optically-transparent member. In other embodiments, a protection varnish may render the optically-transparent member robust against mechanical and/or thermal impact and may thus increase the lifetime of the hermetic package.

In an embodiment, at least part of a surface of the optically-transparent member is transparent for ultraviolet light. This may render the package suitable for UV applications.

In an embodiment, at least part of a surface, in particular at least part of an inner surface and/or of an outer surface, of the optically-transparent member is coated with a reflective coating (for instance is covered with a metal coating such as a silver coating). By taking this measure, propagation paths of electromagnetic radiation from and/or to the optical component may be precisely defined, and undesired optical paths may be disabled.

In an embodiment, the package comprises at least one vertical through-connection connecting the optical component through the base body with an environment of the hermetic package. By guiding one or more vertical through connections through the base body, it may be possible to electrically connect the optical component along a very short connection path extending directly to the base body. This may keep signal and power losses as well as ohmic heating advantageously small. For instance, such vertical through connections may be copper-filled laser vias extending vertically through one or more electrically-insulating layer structures of organic component-carrier material. Additionally or alternatively, such vertical through connections may also extend through inorganic material of the hermetic package.

In an embodiment, the at least one vertical through-connection is formed by an insulated-metal substrate (IMS). An IMS may be a heat removing circuit board with a metallic core. More specifically, a metallic core (in particular made of aluminum or copper) may be separated from electrically-conductive traces by a heat-conducting dielectric layer in an IMS. In other words, an IMS substrate may be implemented in the hermetic package as heat sink, wherein the metallic material of the IMS substrate may remove heat generated by the optical component during operation of the package.

In an embodiment, the package comprises at least one further component, in particular a driver for the optical component, embedded in the hermetic package, in particular in at least one of the organic material and the inorganic material. By embedding at least one further component in the package, a highly-compact arrangement with high functionality may be obtained. As an alternative to embedding such a further component, it is also possible to surface mount such a further component, for instance on the base body. In particular, the at least one further component may be electrically coupled with the optical component, in particular when the further component is a controller or driver or other semiconductor chip cooperating with the optical component.

In an embodiment, the optical component is at least partially surrounded by or coated with a thermally highly-conductive coating (in particular having a thermal conductivity of at least 50 W/mK), in particular aluminum nitride (AlN). By taking this measure, the high amount of heat which may be generated in an interior of the hermetic package during operating the optical component may be at least partially removed by the thermally highly-conductive coating.

In an embodiment, the optical component is mounted slanted, in particular 90° rotated, on the base body so that a light emission or detection direction of the optical component is oriented at least partially upwardly. In certain configurations of the optical component, for instance when embodied as a laser diode, it may be possible that the light-emitting surface of the optical component is oriented perpendicular to a mounting surface of the optical component on the base body. It may then for instance be possible in an embodiment to redirect the emitted light by a redirection mirror or other light-reflecting surface in the hermetic package so that the light propagates vertically outside of the optical component. However, according to the presently described embodiment, it may be possible to render such a reflective surface or mirror dispensable when tilting the optical component so that the light-emitting surface emits the light directly upwardly. It may then be necessary to connect one or more electric contacts of the optical component to the base body by one or more bond wires.

In an embodiment, at least a portion of a surrounding of the optical component consists of bulk metal, in particular bulk copper. Such a bulk metal (for instance having a thickness of more than 100 µm, in particular of more than 150 µm) may significantly contribute to heat removal from the optical component in the inside of the hermetic package towards an environment. Providing bulk copper is properly compatible with component-carrier manufacturing technology, i.e. processes of processing the organic material. For instance, referring to the embodiment of FIG. 13 to FIG. 16, the organic material of one or both of the two upper cores can be replaced by bulk copper, for instance a copper plate or a thick copper foil.

In an embodiment, the package comprises a lid or cap body connected with the base body so that the optical component is enclosed in between. Thus, the package may be composed of two casing parts, i.e. the base body and a cap body functioning as a lid. Base body and cap body may delimit an accommodation volume (in particular a cavity) accommodating the optical component. Such a concept may simplify manufacture of the hermetic package.

Correspondingly, the method may comprise connecting a cap body with the base body so that the optical component is enclosed in between. In particular, such a connection for hermetically sealing may comprise at least one of the group consisting of sintering, diffusion soldering, and glass sealing, in particular by low-melting glass paste. The mentioned connection media (i.e., sinter paste, solder paste, glass paste) may form part of the inorganic material hermetically surrounding the optical component.

In an embodiment, each of the base body and the cap body comprises part of said inorganic material, in particular at least partially delimiting a cavity which may be formed in the base body and/or the cap body. In order to contribute to the hermetic sealing of the optical component within the package, both the base body and the cap body may have a respective part of the inorganic material used for that purpose.

In an embodiment, each of the base body and the cap body comprises part of said organic material, in particular comprises a respective component carrier. In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed-circuit board, an organic interposer, and an IC (integrated circuit) substrate. A component carrier may also be a hybrid board combining different ones of the above-mentioned types of component carriers. Thus, the base body and the cap body may both be manufactured on the basis of organic material such as FR4 or prepreg in which part of the inorganic material may be embedded and/or on which part of the inorganic material may be attached. Thus, both base body and cap body may benefit from the advantages of component-carrier manufacturing technology being synergistically combined with the advantages of inorganic material by exemplary embodiments of the invention.

In an embodiment, the method comprises accommodating the optical component in a hollow cavity delimited by the inorganic material, wherein in particular the hollow cavity is evacuated and/or filled with an inert gas. Filling the void of the cavity which is not filled with material of the optical component with an inert gas or by forming a vacuum in such a void volume may prevent undesired processes in an interior of the hermetic package and may allow to precisely define the atmosphere in which the optical component remains.

In an embodiment, hermetically enclosing the optical component along all surrounding sides is accomplished by providing a continuous uninterrupted cage of said inorganic material between the optical component and a surrounding of the package. Said casing may completely or entirely delimit the cavity, or may be arranged spaced with regard to the cavity (the latter may then be defined for instance exclusively by organic material).

In an embodiment, the inorganic material hermetically enclosing the optical component along all surrounding sides comprises an electrically-conductive sidewall coating which coats at least part of vertical sidewalls delimiting the cavity (see for example FIG. 12). The inorganic-hermetic cage may then be formed by said sidewall coating in combination with upper and lower ceramic and/or glass and/or metallic members, and in combination with inorganic (in particular metallic) connection medium for accomplishing a connection, for instance by soldering or sintering, between said inorganic constituents.

In an embodiment, the inorganic material hermetically enclosing the optical component along all surrounding sides comprises electrically-conductive material circumferentially filling a circumferential hole extending at least partially through said organic material (see for example FIG. 11). The inorganic-hermetic cage may then be formed by said metal filled circumferential slot in combination with upper and lower ceramic and/or glass and/or metallic members, and in combination with inorganic (in particular metallic) connection medium for accomplishing a connection, for instance by soldering or sintering, between said inorganic constituents.

In an embodiment, organic material forms part of a component carrier comprising a stack formed of at least one electrically-conductive layer structure and/or at least one electrically-insulating layer structure. Hence, the organic material of base body and/or cap body may be provided as a printed-circuit board or an IC substrate. For example, the component carrier may be a laminate of the mentioned electrically-insulating layer structure(s) and electrically-conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the method comprises forming electrically-conductive material (in particular copper) on the inorganic material (in particular glass) by a chemical deposition. It turned out that adhesion between glass and copper can be further improved by a chemical deposition of copper. Also, a chemical deposition of copper oxide may be possible (Cu(I) deposition).

In an embodiment, the inorganic material (in particular glass) is connected with electrically-conductive material (in particular copper) through a seed layer (in particular one of copper oxide and titanium). Adhesion may be improved if pure copper is separated from glass by a seed layer in between.

In an embodiment, the method comprises forming nickel on copper (in particular by a chemical deposition), and thereafter connecting the inorganic material (in particular glass) with the nickel. It was found that by chemically depositing nickel on copper surfaces, a proper wetting of molten glass (such as glass frits) occurs.

In an embodiment, the component carrier is shaped as a plate. This contributes to the compact design, wherein the component carrier nevertheless provides a large basis for mounting components thereon. Furthermore, in particular a naked die as example for an embedded-electronic component, can be conveniently embedded, thanks to its small thickness, into a thin plate such as a printed-circuit board. A plate-shaped component carrier also ensures short electric connection paths, and therefore suppresses signal distortion during transport.

In an embodiment, the component carrier is configured as one of the group consisting of a printed-circuit board, a substrate (in particular an IC substrate), and an interposer.

In the context of the present application, the term "printed-circuit board" (PCB) may particularly denote a plate-shaped component carrier which is formed by laminating several electrically-conductive layer structures with several electrically-insulating layer structures, for instance by applying pressure and/or by the supply of thermal energy. As preferred materials for PCB technology, the electrically-conductive layer structures are made of copper, whereas the electrically-insulating layer structures may comprise resin and/or glass fibers, so-called prepreg or FR4 material. The various electrically-conductive layer structures may be connected to one another in a desired way by forming through-holes through the laminate, for instance by laser drilling or mechanical drilling, and by filling them with electrically-conductive material (in particular copper), thereby forming vias as through-hole connections. Apart from one or more components which may be embedded in a printed-circuit board, a printed-circuit board is usually configured for accommodating one or more components on one or both opposing surfaces of the plate-shaped printed-circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed-circuit board (PCB), however with a considerably higher density of laterally and/or vertically-arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed-circuit board or intermediate printed-circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, each of the above-mentioned electrically-insulating layer structures comprises at least one of the group consisting of resin (such as reinforced or non-reinforced resins, for instance epoxy resin or bismaleimide-Triazine resin), cyanate ester, polyphenylene derivate, glass (in particular glass fibers, multi-layer glass, glass-like materials), prepreg material (such as FR-4 or FR-5), polyimide, polyamide, liquid-crystal polymer (LCP), epoxy-based build-up film, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high-frequency applications, high-frequency materials such as polytetrafluoroethylene, liquid-crystal polymer and/or cyanate-ester resins, low-temperature cofired ceramics (LTCC) or other low, very low or ultra-low DK-materials may be implemented in the component carrier as electrically-insulating layer structure.

In an embodiment, each of the above-mentioned electrically-conductive layer structures comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one further component may be surface mounted on and/or embedded in the package and can in particular be selected from a group consisting of an electrically non-conductive inlay, an electrically-conductive inlay (such as a metal inlay, preferably comprising copper or aluminum), a heat-transfer unit (for example a heat pipe), a light-guiding element (for example an optical waveguide or a light-conductor connection), an electronic component, or combinations thereof. For example, the component can be an active electronic component, a passive electronic component, an electronic chip, a storage device (for instance a DRAM or another data memory), a filter, an integrated circuit, a signal-processing component, a power-management component, an optoelectronic-interface element, a light-emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy-harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electro-magnetic radiation propagating from an environment, may be used as component.

After processing interior-layer structures of the component carrier, it is possible to cover (in particular by lamination) one or both opposing main surfaces of the processed layer structures symmetrically or asymmetrically with one or more further electrically-insulating layer structures and/or electrically-conductive layer structures. In other words, a build-up may be continued until a desired number of layers is obtained.

After having completed formation of a stack of electrically-insulating layer structures and electrically-conductive layer structures, it is possible to proceed with a surface treatment of the obtained layers structures or component carrier.

In particular, an electrically-insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically-conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically-conductive surface portions of the component carrier in terms of surface treatment. Such a surface finish may be an electrically-conductive cover material on exposed electrically-conductive layer structures (such as pads, conductive tracks, etc., in particular comprising or consisting of copper) on a surface of a component carrier. If such exposed electrically-conductive layer structures are left unprotected, then the exposed electrically-conductive component-carrier material (in particular copper) might oxidize, making the component carrier less reliable. A surface finish may then be formed for instance as an interface between a surface-mounted component and the component carrier. The surface finish has the function to protect the exposed electrically-conductive layer structures (in particular copper circuitry) and enable a joining process with one or more components, for instance by soldering. Examples for appropriate materials for a surface finish are OSP (Organic-Solderability Preservative), Electroless-Nickel Immersion Gold (ENIG), gold (in particular Hard Gold), chemical tin, nickel-gold, nickel-palladium, etc.

In an embodiment, the component carrier is a laminate-type component carrier. In such an embodiment, the component carrier is a compound of multiple-layer structures which are stacked and connected together by applying a pressing force and/or heat.

The aspects defined above and further aspects of the invention are apparent from the examples of embodiment to be described hereinafter and are explained with reference to these examples of embodiment.

BRIEF DESCRIPTION OF THE DRAWINGS

FIG. 1, FIG. 2, FIG. 3, FIG. 4, FIG. 5, FIG. 6, FIG. 7, FIG. 8 to FIG. 9 illustrate cross-sectional views of structures obtained during carrying out a method of manufacturing a hermetic package with an embedded-optical component, shown in FIG. 9, according to an exemplary embodiment of the invention.

FIG. 10 and FIG. 11 illustrate cross-sectional views of structures obtained during carrying out a method of manufacturing a hermetic package with an embedded-optical component, shown in FIG. 11, according to another exemplary embodiment of the invention.

FIG. 12 illustrates a cross-sectional view of a hermetic package with an embedded-optical component according to still another exemplary embodiment of the invention.

FIG. 13, FIG. 14, FIG. 15 to FIG. 16 illustrate cross-sectional views of structures obtained during carrying out a method of manufacturing a hermetic package with an embedded-optical component, shown in FIG. 16, according to yet another exemplary embodiment of the invention.

FIG. 17, FIG. 18, FIG. 19, FIG. 20, FIG. 21, FIG. 22, FIG. 23, FIG. 24, FIG. 25 to FIG. 26 illustrate cross-sectional views of structures obtained during carrying out a method of manufacturing a hermetic package with an embedded-optical component, shown in FIG. 26, according to yet another exemplary embodiment of the invention.

DETAILED DESCRIPTION OF EXEMPLARY EMBODIMENTS

Figure 7:
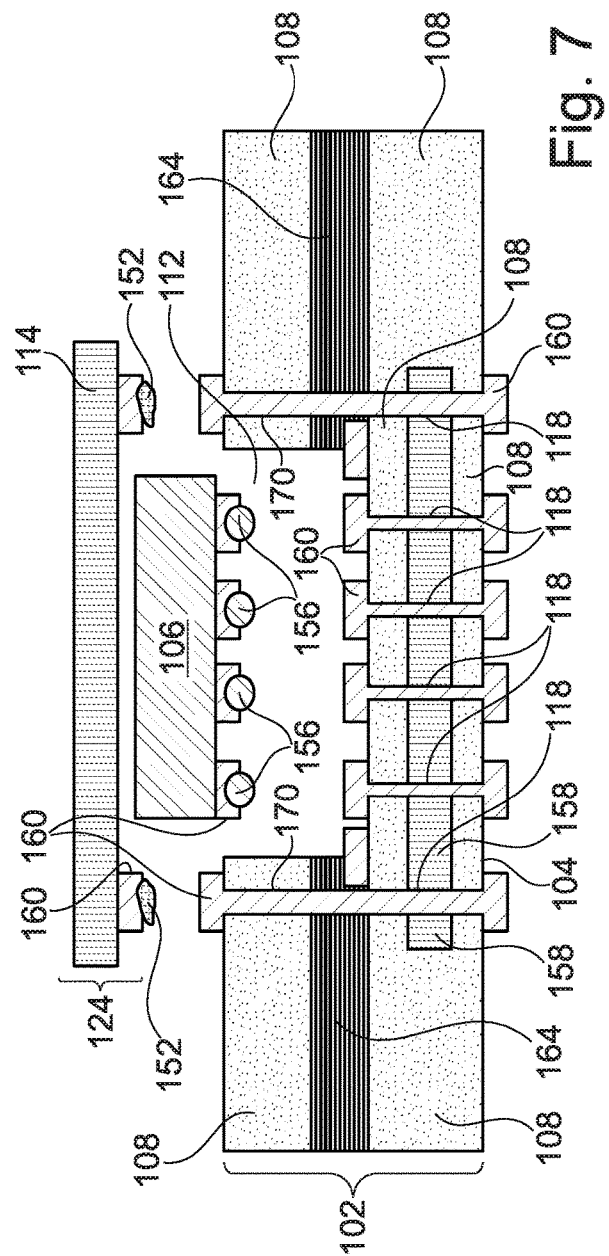

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the invention have been developed.

According to an exemplary embodiment of the invention, a hermetic package is provided which hermetically encloses one or more optical components by using a combination of organic and inorganic material to form the hermetic surrounding. Advantageously, building a heterogeneous system may be accomplished by using assemblable materials, which allow a simplification of the production compared to a homogeneous system with inorganic materials. For instance, the hermetically-sealed optical component may comprise a UV laser diode, an optical sensor, a MEMS (microelectromechanical system) package, an LED (light-emitting diode) package or array, and/or a smart glasses image projector. In particular with the help of organic FR4 material that takes over a carrier function during production, glass-metal constructions may be produced as inorganic constituents of the hermetic package. Thus, a combination of organic and inorganic materials may be used for manufacturing a hermetic package accommodating an optical component. Building a heterogeneous system by using assemblable materials may allow a simplification of the production compared to a homogeneous system with inorganic materials only.

In an embodiment, such a hermetic package may be composed of two parts, in addition to the optical component:

An upper part (such as a cap body) may be made of two cores with inserted glass window in the upper of the two cores. The upper core and the lower core may be laminated together. A lower cavity may be formed by laser cutting (for instance by implementing a non-adhesive release layer embedded in the core, and by cutting out, by laser cutting, a piece of the core delimited at the bottom side by the release layer so that the piece can be simply taken out so that the cavity remains). Thereafter, plating of the cavity and execution of a photo process may be carried out. The upper cavity may also be formed by laser cutting (for instance by implementing a non-adhesive release layer embedded in the core, and by cutting out, by laser cutting, a piece of the core delimited at the bottom side by the release layer so that the piece can be simply taken out so that the cavity remains).

Furthermore, the lower part (for instance base body) may be formed in the same way as the core with the glass window.

Thereafter, the upper part and the lower part of the package may be hermetically sealed, for instance by sintering, diffusion soldering, and/or glass sealing by low melting glass paste.

What concerns the production of the upper part or lid for the hermetic package, a release layer may be applied on both sides of the glass element, which ensures consequently that the overlying organic elements can be removed. This glass element has metal structures (single-sided or double-sided) that allow a galvanic connection of a later-built cavity. This glass element may be inserted into a PCB or IC substrate.

FIG. 1 to FIG. 9 illustrate cross-sectional views of structures obtained during carrying out a method of manufacturing a hermetic package 100 with an embedded optical component 106, shown in FIG. 9, according to an exemplary embodiment of the invention.

Referring to FIG. 1, a preform of a base body 102 is shown which is obtained by processing or correspondingly configuring a plate-shaped laminate-type component carrier 130. The component carrier 130 may be configured as a laminated stack of electrically conductive layer structures (for instance continuous and/or patterned metal layers such as copper foils, and/or metallic vertical-interconnect structures such as copper filled laser vias) and electrically-insulating layer structures (for instance comprising resin, in particular epoxy resin, optionally comprising reinforcing particles such as glass fibers or glass spheres; for instance, the electrically-insulating material may be prepreg or FR4). More specifically, the electrically-conductive layer structures comprise vertical through connections 118 and horizontal planar portions forming pads 160.

The preform of base body 102 is used as a basis for creating a first part of the hermetic package 100. The preform of base body 102 has a bottom 104 having dielectric material being made of organic material 108, for instance epoxy resin of the lower one of said electrically-insulating layer structures. Vertical through-connections 118 are formed extending vertically through said dielectric material for establishing an electrically-conductive connection extending vertically through the preform of base body 102. For instance, the vertical through connections 118 may be copper filled vias, which may be formed for instance by laser drilling or mechanical drilling.

As further shown in FIG. 1, an inorganic inlay 158, for instance a glass plate or a ceramic plate, may be embedded in preform of base body 102. For instance, the preform of base body 102 may be configured as a printed-circuit board with embedded glass plate. Inorganic inlay 158 may later ensure that an optical component 106 to be hermetically sealed within hermetic package 100 is completely hermetically surrounded by inorganic material 110 (compare FIG. 9). In the shown embodiment, an inorganic material (for example made of glass, ceramics, etc.) in form of inorganic inlay 158 may be inserted into the core or PCB (printed-circuit board) type component carrier 130. Subsequently, the vertical interconnect structures 118, embodied as vias, may be formed (by the formation of holes in component carrier 130 and the subsequent formation of a metallization).

Referring to FIG. 2, part of an upper-main surface of the structure shown in FIG. 1 may be provided with a release layer 162. The release layer 162 may be made of a non-adhesive material (such as a waxy material or Teflon®) and may later serve as a basis for the formation of a cavity 112 (see FIG. 6), as described below. Thus, by applying the release layer 162, the cavity 112 can be produced later.

Furthermore, an electrically-conductive layer 166 may be optionally attached to a lower-main surface of the preform of base body 102.

Moreover, an at least partially-uncured dielectric layer 164 (for instance made of prepreg) and a further PCB-type component carrier 130 are shown. Said further component carrier 130 may be a core which may comprise an organic material 108 as further electrically-insulating layer structure (which is here embodied as a fully-cured electrically-insulating layer structure such as an FR4 layer), and an electrically-conductive layer 166 (such as a copper foil).

Referring to FIG. 3, the illustrated structure is obtained by laminating together the constituents shown in FIG. 2. Lamination may be accomplished by the application of heat and/or pressure. Hence, the prepreg layer 164 may be laminated with further component carrier 130 (or a copper foil or a core) on top and the structure with the applied release layer 162 on bottom to continue formation of base body 102. During lamination, material of the uncured-layer structure 164 may be cured, thereby connecting the various constituents together.

Referring to FIG. 4, a circumferential hole 168 may be formed in a lower portion of the structure shown in FIG. 3, for instance by laser processing from a bottom side (for example using an ultraviolet laser or a carbon-dioxide laser). By creating the circumferential hole 168 (which may be a circumferential slot) in the lower portion of the shown layer stack, the hermetic inorganic cage of package 100 to be manufactured is further designed. More specifically, the described formation of circumferential hole 168 prepares a subsequent copper metallization around a hermetic cavity 112 shown in FIG. 6. Upper electrically-conductive layer 166 may remain continuous (i.e. may not be patterned by the laser processing) and may serve for holding together the various constituents of the structure shown in FIG. 4.

Referring to FIG. 5, the previously formed circumferential hole 168 may be filled with electrically-conductive material 170, for instance copper. For example, this may be done by galvanic plating. Thus, subsequent to the formation of the circumferential hole 168, the filling of the slot with copper takes place. By taking this measure, a circumferentially closed portion of the inorganic-hermetic sealing is created.

Moreover, the electrically-conductive layers 166 on the top side and on the bottom side of the structure shown in FIG. 4 are patterned. Hence, structuring of the respective electrically-conductive layer 166 on both opposing main surfaces of the structure according to FIG. 4 takes place.

Referring to FIG. 6, cavity 112 is formed to thereby complete formation of base body 102 by cutting out a central piece of the structure shown in FIG. 5 after formation of a further inner circumferential cutting slot (for instance by a circumferential laser cut). Said cutting slot may extend from an upper main surface of the structure shown in FIG. 5 up to the release layer 162. In view of the non-adhesive property of the material of the release layer 162, the cut-out piece may be simply taken out and removed from the remaining base body 102, so that the cavity 112 remains. After that, the release layer 162 may also be removed. Hence, FR4 material of the uppermost layer structures of FIG. 5 may be cut. This forms the cavity 112 by means of laser processing. Subsequently, the material inside of the cavity 112 can be removed. Optionally, the cavity 112 can be cleaned, and a surface finish can be carried out.

Referring to FIG. 7, an inlay-type optical component 106 is shown during insertion into cavity 112. For example, the optical component 106 may be a light emitter and/or a light detector. For instance, the optical component 106 may be configured as a semiconductor chip. In one embodiment, the optical component 106 may be active in the infrared range, for instance for a LIDAR application. Additionally or alternatively, the optical component 106 may be active in the visible range of wavelengths, for instance for a RADAR application. Also, ultraviolet applications are possible with optical component 106.

In addition, a cap body 124 is shown which comprises an optically transparent member 114 such as a glass body. The transparent member 114 is configured so that light can propagate between the optical component 106 and an environment of the readily manufactured hermetic package 100. For instance, the optically-transparent member 114 may comprise a lens. This can be accomplished by rendering one or both opposing main surfaces of the optically-transparent member 114 curved (for instance with a convex or concave curvature). Alternatively, optically-transparent number 114 may be a planar plate.

A connection medium 152, such as sinter paste, solder paste or glass paste, may be formed on a bottom side of the cap body 124 (or alternatively on the top side of the lower part formed based on the base body 102). Later on, cap body 124 and base body 102 may be connected by the connection medium 152, for instance by sintering or soldering.

A component-connection medium 156 may be applied to pads 160 of the optical component 106 (or alternatively to electrically conductive pads 160 or lands exposed on the bottom of cavity 112 and thus on a mounting surface of base body 102). For instance, the component-connection medium 156 may be solder material for diffusion soldering or sinter material for sintering.

In the shown embodiment, each of the base body 102 and the cap body 124 comprises part of said inorganic material 110 used for hermetically sealing of the optical component 106 (see FIG. 9). Only the base body 102 comprises organic material 108 in the shown embodiment.

Figure 8:
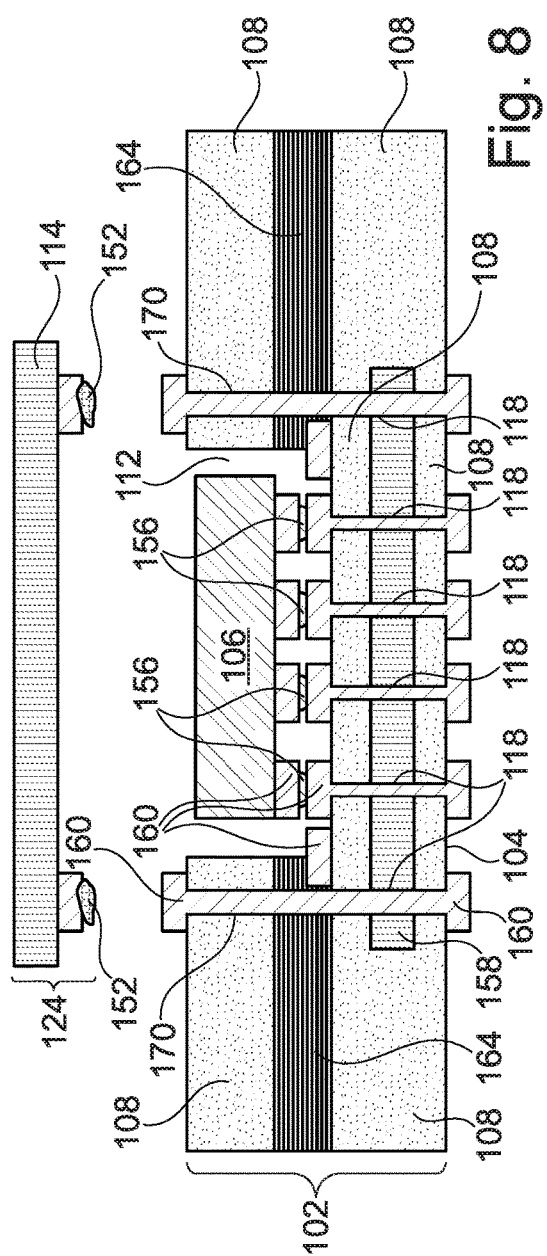

Referring to FIG. 8, pads 160 of the optical component 106 may be interconnected with pads 160 of base body 102 at the bottom of the cavity 112, for instance by the formation of a solder connection using connection medium 156. Hence, FIG. 8 shows assembly of the optical component 106 on the base body 102.

Referring to FIG. 9, the cap body 124 is connected with the base body 102 (with optical component 106 mounted thereon) by means of connection medium 152 (in particular by soldering). As a result, the optical component 106 is accommodated in cavity 112 and is enclosed in between base body 102 and cap body 124. More specifically, the optical component 106 is accommodated within a cage defined exclusively by inorganic material 110 at all sides. Thus, the described manufacturing architecture three-dimensionally hermetically surrounds the optical component 106 with inorganic material 110 around all sides. According to FIG. 9, this purely inorganic cage of inorganic material 110 is formed by the optically-transparent member 114, the inorganic inlay 158, the circumferentially-closed electrically-conductive material 170, pads 160 and connection medium 152.

Optionally, the hollow cavity 112 may be evacuated and/or filled with an inert gas, depending on a specific application.

Concluding, the obtained and illustrated hermetic package 100 comprises at its bottom side the base body 102, wherein dielectric material at a bottom 104 of the base body 102 is made of organic material 108 in form of epoxy resin. The optical component 106 is mounted on the base body 102 and within the cavity 112. Inorganic material 110, composed of inorganic inlay 158 at a bottom side, optically-transparent member 114 at a top side and metallic material of hollow-cylindrical structure 170, pads 160 and connection medium 152 (which may be a metallic compound) in circumferential directions hermetically enclose the optical component 106 along all surrounding sides (i.e. top, bottom, and along a horizontal circumference). Furthermore, the optical component 106 is accommodated in the hollow cavity 112 which is delimited partially by the inorganic material 110 and partially by organic material 108.

As shown, the hermetic package 100 is formed based on component carriers 130 comprising organic-dielectric material (see reference numeral 108), so that the efficient manufacturing processes related to component carrier (in particular PCB) technology may be advantageously used. However, the hermetic package 100 hermetically enclosing optical component 106 synergistically combines this organic-packaging concept with the use of inorganic material 110 for accomplishing any desired degree of hermetically sealing (i.e. sealing against air, humidity, dust or dirt).

Hermetically sealing the cavity 112 with cap body 124 or lid (for instance comprising or consisting of glass or a core with inserted glass element(s)) may hence be accomplished. Space around the optical component 106 may be evacuated and/or filled with inert gas and then hermetically sealed.

FIG. 10 and FIG. 11 illustrate cross-sectional views of structures obtained during carrying out a method of manufacturing a hermetic package 100 with an embedded optical component 106, shown in FIG. 11, according to another exemplary embodiment of the invention.

Referring to FIG. 10, a cap body 124 is provided in which the optically-transparent member 114 (such as a glass plate, for instance made of a UV-transparent glass) is embedded in organic material 108. Said organic material 108 may for instance be epoxy resin, optionally comprising reinforcing particles such as glass cloth.

An optional recess 154 in cap body 124 of FIG. 10 may be formed by inserting a release layer (not shown, compare reference numeral 162 in FIG. 2) inside recess 154, and subsequently removing material using said release layer. Only a small remainder of the material of release layer 162 is shown in FIG. 10, which may remain in the readily manufactured hermetic package 100 due to alignment reasons. It is also possible to fill at least part of the recess 154 (or provide a recess-free planar-exterior surface of the hermetic package 100) with a conversion structure (such as a layer) for converting light emitted by the optical component 106 into white light.

The base body 102 with assembled optical component 106 of FIG. 10 may be configured as in FIG. 8.

Referring to FIG. 11, a hermetic package 100 according to an exemplary embodiment of the invention is shown which is obtained by connecting the base body 102 with the cap body 124 shown in FIG. 10, for instance by soldering, sintering, etc. of (for instance metallic) connection medium 152.

The embodiment of FIG. 10 and FIG. 11 is based on the use of component carriers 130 for forming both the base body 102 and the cap body 124.

Hermetic packages 100 according to an exemplary embodiment of the invention may be manufactured as a single hermetic package, or in a batch procedure. When the hermetic package 100 of FIG. 11 is formed in such a batch procedure or by a panel-level process, a common component-carrier structure comprising multiple preforms of hermetic packages 100 may be separated into individual hermetic packages 100, for instance by cutting along separation lines 172 as shown schematically in FIG. 11.

FIG. 12 illustrates a cross-sectional view of a hermetic package 100 with an embedded optical component 106 according to still another exemplary embodiment of the invention.

The embodiment of FIG. 12 differs from the embodiment of FIG. 9 in particular in that the slot-shaped hollow-cylindrical structure 168 filled with electrically-conductive material 170 of FIG. 9 is substituted by an electrically-conductive sidewall coating 174 coating sidewalls of organic material 108 of the base body 102, which sidewalls partially delimit cavity 112. The electrically-conductive sidewall coating 174 may be made of copper material, which may be formed for instance by plating. The electrically-conductive sidewall coating 174 (which may be substantially U-shaped on both sides of the cavity 112 in the shown cross-sectional view) contributes to the hermetic surrounding of optical component 106 by inorganic material 110.

Furthermore, additional connection medium 176 is provided for connecting different portions of the base body 102 and also contributes to hermetically sealing the optical component 106 mounted on the base body 102 by a cage or shell made exclusively of inorganic material 110. For instance, connection medium 176 may be metallic (for example may comprise or consist of silver), and connection medium 176 may be used for connecting substructures of the base body 102 by sintering.

In the embodiment of FIG. 12, the inorganic material 110 forms an uninterruptedly continuous inorganic-cage delimiting cavity 112 completely, and being surrounded with an organic surrounding, i.e. organic material 108 of the various substructures of base body 102.

According to FIG. 12, said inorganic material 110 hermetically enclosing optical component 106 is composed of inorganic inlay 158 at a bottom side, optically-transparent member 114 at a top side and metallic material of electrically-conductive sidewall coating 174, pads 160 and connection medium 152, 176 in circumferential directions.

FIG. 13 to FIG. 16 illustrate cross-sectional views of structures obtained during carrying out a method of manufacturing a hermetic package 100 with an embedded optical component 106, shown in FIG. 16, according to yet another exemplary embodiment of the invention.

Referring to FIG. 13, three different cores 178, 180, 182 are used as a basis for manufacturing hermetic package 100 shown in FIG. 16.

In this embodiment, core 180 is provided with a cavity 112, which is subsequently metallized by copper to form sidewall coating 174 on sidewalls of the cavity 112 in the hermetic package 100.

Core 178 is configured as a fully-cured core (in particular a FR4 core) in which inorganic inlay 158 (for instance made of ceramic or glass) is embedded. Subsequently, vias are inserted and a metal pattern is applied. Said vias form the vertical through connections 118 for the optical component 106 that is accommodated in the hermetic package 100. Said metal pattern form pads 160. The optical component 106 can be, for example, a light source (for instance a laser diode, an LED), an optical sensor (for instance an image sensor), etc.

After interconnection by connection medium 176, cores 178, 180 form base body 102.

Core 182 (being the basis of cap body 124, cover or lid) is similar in construction to core 178 but without vias, and has organic material 108 above optically-transparent member 114. Organic material 108 above optically-transparent member 114 is partially removed (for instance using a release layer 162, only a rest of the latter is shown in FIG. 13) to provide transparent properties of an optical path between optical component 106 and an environment above the hermetic package 100. Alternatively, core 182 may be substituted by an optically-transparent member 114 (in particular a pure glass element) surrounded by a metal, for instance by bulk copper, but without organic material 108. The latter embodiment may be particularly advantageous in terms of removal of heat generated by the optical component 106 during operation of the hermetic package 100.

Further, any of cores 178, 118 may be provided with a connection medium 152, 156, 176 for forming a metallic bond (for instance by soldering, sintering, diffusion soldering, welding, etc.).

Referring to FIG. 14, the optical component 106 may be placed in the cavity 112 and may be connected with core 178 of base body 102 using connection medium 156 for interconnecting pads 160 of optical component 106 with pads 160 of the core 178. The only connection between the lower cores 178, 180 constituting base body 110 on the one hand and cap body 124 is accomplished by connection medium 152, such as sinter paste, solder paste or glass paste.

Referring to FIG. 15, core 182 is then placed on core 180, wherein the space around the optical component 106 may be optionally evacuated and/or filled with inert gas or any other appropriate gaseous atmosphere. Upon connection cores 180, 182 using connection medium 152, the optical component 106 is hermetically sealed within cavity 112.

Referring to FIG. 16, the illustrated hermetic package 100 can be obtained by singularizing the panel-level manufactured structure according to FIG. 15 by cutting along separation lines 172.

As in FIG. 12, inorganic material 110 forms, also in FIG. 16, an uninterruptedly continuous inorganic area or cage delimiting cavity 112 completely, and being surrounded with an organic surrounding. In core 180 according to FIG. 13, the sidewalls of the organic material 108 are metallized so that the entire inner surface of the material encapsulating optical component 106 is formed by inorganic material 110 rather than by organic material 108.

Figure 25:
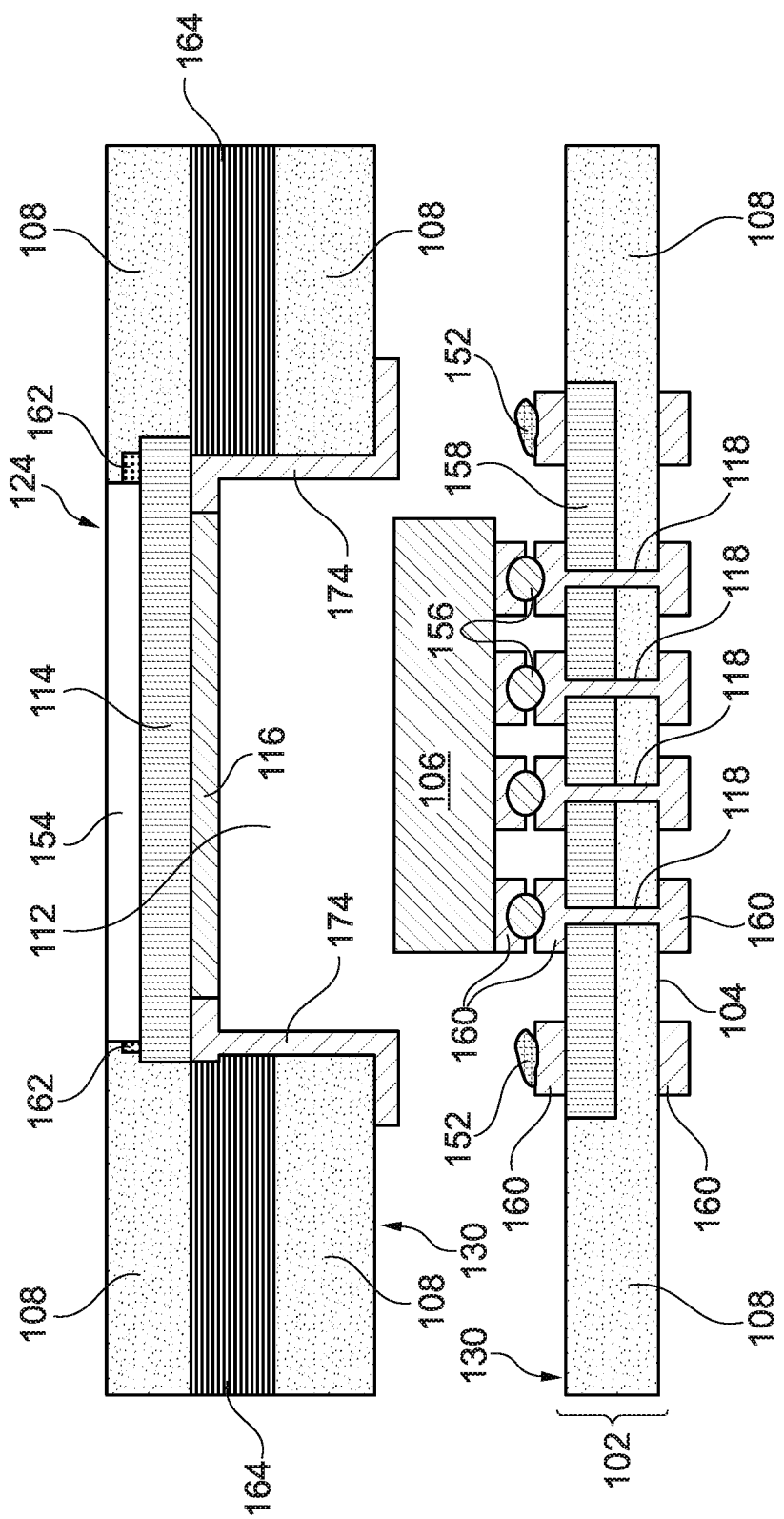
Figure 26:
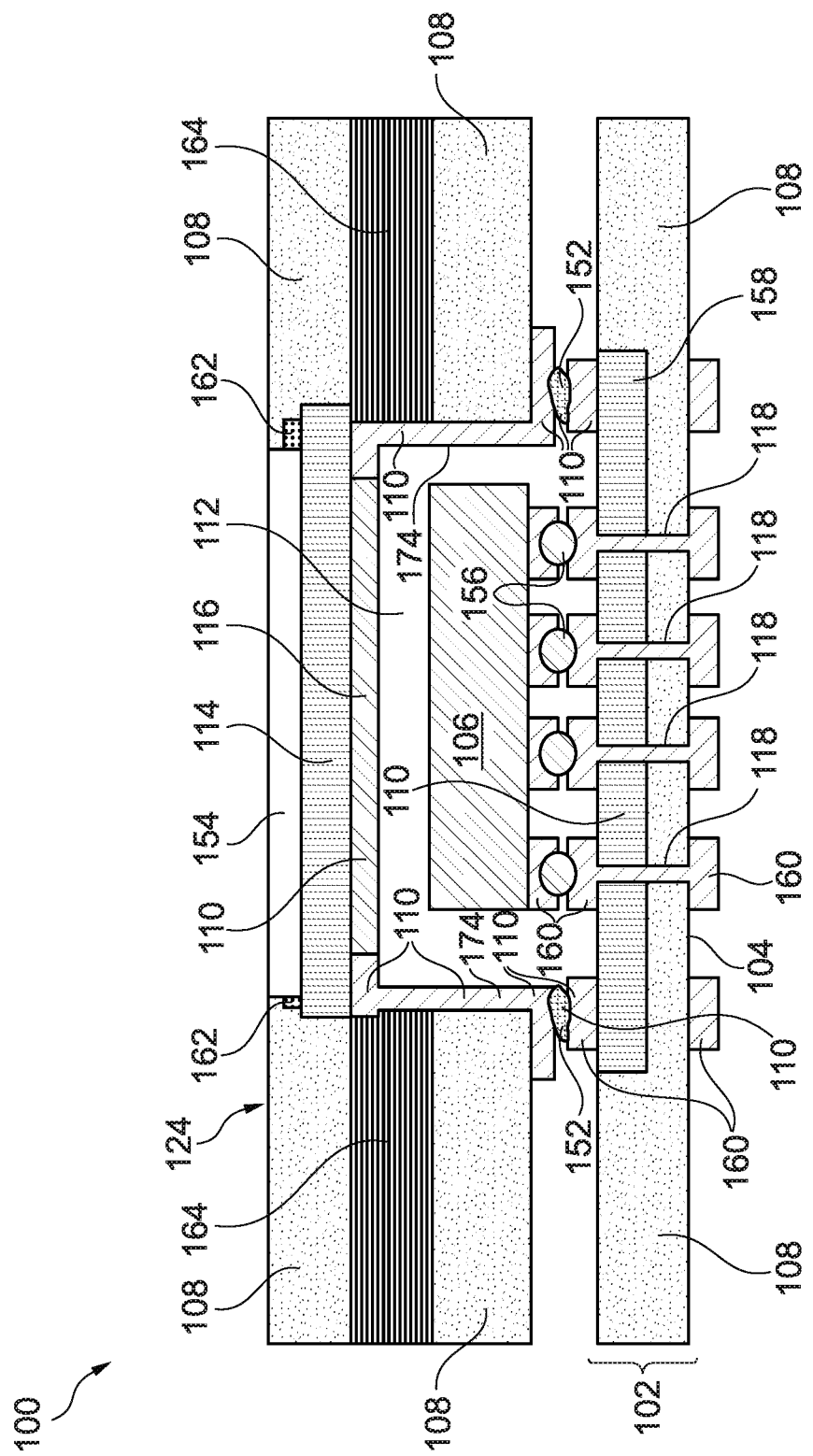

FIG. 17 to FIG. 26 illustrate cross-sectional views of structures obtained during carrying out a method of manufacturing a hermetic package 100 with an embedded-optical component 106, shown in FIG. 26, according to yet another exemplary embodiment of the invention.

Referring to FIG. 17, a component carrier 130 is provided, in which optically transparent member 114 is embedded in an arrangement of electrically-conductive layer structures (compare reference numerals 160) and electrically-insulating layer structures (compare reference numerals 108, 164). Furthermore, a release layer 162 made of non-adhesive material is embedded in the component carrier 130, partially above and partially below optically-transparent member 114. The shown structure may be obtained by pressing together a PCB or IC substrate with another core and prepreg, and with optically-transparent member 114 and release layer 162 in between.

Referring to FIG. 18, the structure shown in FIG. 17 may be made subject to a laser-cutting procedure, during which a laser beam 184 cuts a circumferential hole into the structure shown in FIG. 17 from a top side and extending into the upper portion of the release layer 162.

The structure shown in FIG. 19 may be obtained by removing a piece of the structure of FIG. 18 delimited laterally by laser beam 184 and at a bottom side by the upper portion of the release layer 162. After cutting the cavity 112 by laser cutting, the cut-out piece may hence be removed, and then the upper portion of the release layer 162 may be stripped above optically-transparent member 114.

Referring to FIG. 20, it is then possible to apply a protective varnish 116, for instance made of Teflon® or being Teflon-based, to a surface portion in the glass area of exposed optically-transparent member 114. Varnish supply may be accomplished for example by means of inkjet printing. A function of this protective varnish 116 is the prevention of undesired deposition of opaque material on the optically-transparent member 114, for instance during a chemical-copper process.

Referring to FIG. 21, electrically-conductive material such as copper may then be deposited on both horizontal surfaces and vertical surfaces of the structure shown in FIG. 20, with an exception of the protective varnish 116 (which may be made of a material disabling such a deposition). This may be done by a chemical-copper plating process. Inter alia, the deposition of the electrically-conductive material forms the electrically-conductive sidewall coating 174 on sidewalls delimiting cavity 112.

Referring to FIG. 22, deposited electrically-conductive material is removed from part of the horizontal surfaces of the structure shown in FIG. 21. This may be accomplished, for instance, by a photo process.

Referring to FIG. 23, organic material 108 may be removed from a bottom side of the structure shown in FIG. 22 for exposing also part of the lower-main surface of optically-transparent member 114. In other words, the glass element constituting optically-transparent member 114 may be freed from the organic material 108 thereon on a back side. The result is the shown cap body 124 or cap element.

Referring to FIG. 24, the cap body 124 shown in FIG. 23 may then be turned upside down or by 180°. An optical component 106, having its pads 160 face down, may then be placed between the cap body 124 on the top side and a base body 102 (which may be similar or identical to the one shown in FIG. 1) on the bottom side.

Referring to FIG. 25, assembly of the optical component 106 on a mounting surface of the base body 102 may then be carried out by connection medium 156, for instance by soldering or sintering.

Referring to FIG. 26, hermetic sealing of the package 100 may then be obtained by connecting the lid or cap body 124 to the base body 102 with the mounted-optical component 106 in between by connection medium 152, for instance by soldering or sintering.

According to FIG. 26, said inorganic material 110 hermetically enclosing optical component 106 is composed of inorganic inlay 158 at a bottom side, optically-transparent member 114 at a top side and metallic material of electrically-conductive sidewall coating 174, pads 160 and connection medium 152 in circumferential directions.

Figure 27:
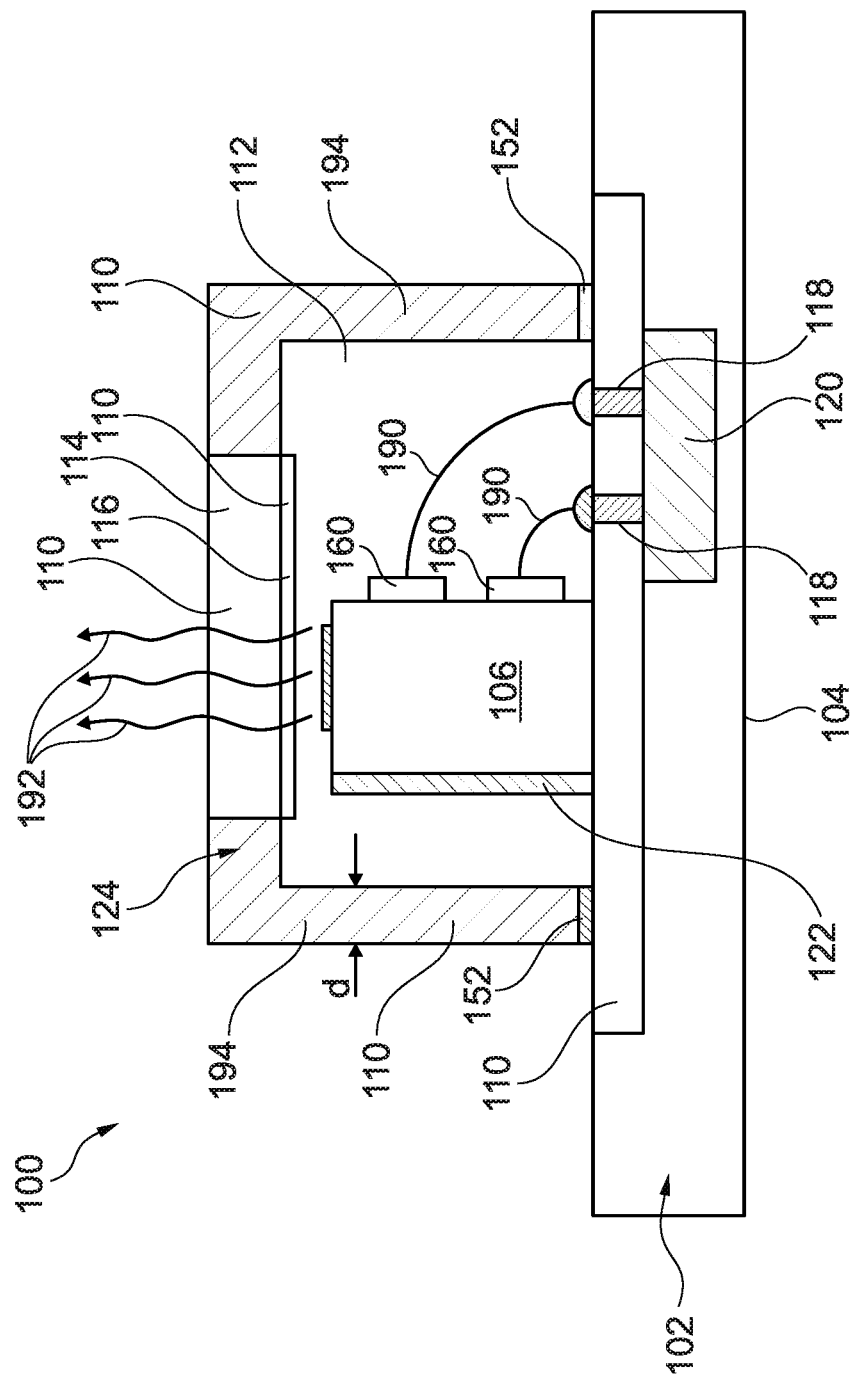
FIG. 27 illustrates a cross-sectional view of a hermetic package with an embedded optical-component according to still another exemplary embodiment of the invention.

FIG. 27 illustrates a cross-sectional view of a hermetic package 100 with an embedded-optical component 106 according to still another exemplary embodiment of the invention.

Hermetic package 100 according to FIG. 27 additionally comprises a further component 120 which is electrically connected with optical component 106. The further component 120 may be a semiconductor chip, for instance a controller or a driver for controlling or driving the optical component 106. As shown, further component 120 may be embedded in the hermetic package 100, in particular in the base body 102. Alternatively, further component 120 may be mounted on the base body 102, for instance side by side with optical component 106. Further alternatively, further component 120 may be embedded in cap body 124. In yet another alternative further component 120 may be surface mounted on cap body 124, either inside or outside of cavity 112.

Moreover, a sidewall of the optical component 106 is covered with a thermally-highly conductive coating 122, such as aluminum nitride, in the embodiment of FIG. 27. This further improves heat removal during operation of hermetic package 100.

As shown in FIG. 27, the optical component 106 is mounted 90° rotated on the base body 102. Consequently, pads 160 of optical component 106 are arranged on a vertical surface of optical component 106, vertically displaced from each other as well as displaced from a mounting surface of base body 102. Bond wires 190 are provided for connecting the pads 160 of optical component 106 with a mounting surface of base body 102. The bond wires 190 thus connect the optical component 106, via vertical through connections 118 extending through base body 102, with further component 120. The optical component 106 shown in FIG. 27 is of the type emitting light through a sidewall (rather than through a top wall), if the main surface corresponding to pads 160 is considered as a bottom main surface of optical component 106. Due to the 90° turning of the optical component 106, it may be ensured that a light-emitting direction (see reference numeral 192) of the optical component 106 is oriented upwardly. In other embodiments, a reflection surface (for instance a reflective mirror, not shown) may be implemented in order to redirect light emitted by optical component 106 or detected by optical component 106 appropriately.

Beyond this, a portion 194 of a surrounding of the optical component 106, more precisely the part of cap body 124 being different from optically-transparent member 114, may consist of bulk copper, for instance having a thickness "d" of at least 100 μm. By taking this measure, heat removal during operation of the hermetic package 100 may be further improved.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A hermetic package, comprising:
a base body comprising a cavity, wherein dielectric material of a bottom of the base body is made of an organic material, wherein an inorganic inlay is adjacent to the cavity and surrounded by the base body; and
an embedded optical component accommodated in the cavity of the base body,
wherein the optical component is hermetically enclosed along all surrounding sides by a continuous uninterrupted inorganic cage between the optical component and an exterior of the package,
wherein the cage comprises the inorganic inlay which extends continuously across the cavity of the base body and is at least partly embedded in the base body.

2. The package according to claim 1, wherein the inorganic inlay is composed of at least one metal, glass and/or ceramic.

3. The package according to claim 1, wherein the organic material comprises resin.

4. The package according to claim 1, comprising at least one of the following features:
wherein the organic material surrounds the optical component at least partially along at least five sides; and
wherein the optical component comprises at least one of the group consisting of an optical-light emitter and an optical-light detector.

5. The package according to claim 1, comprising an inorganic optically-transparent member through which light can propagate between the optical component and an environment of the hermetic package.

6. The package according to claim 5, comprising at least one of the following features:
wherein the optically-transparent member comprises a lens;
wherein the optically-transparent member is at least partially embedded in organic material;
wherein at least part of a surface of the optically-transparent member is coated with a protection varnish configured for inhibiting deposition of metallic material thereon;
wherein at least part of a surface of the optically-transparent member is transparent for ultraviolet light; and
wherein at least part of a surface of the optically-transparent member is coated with a reflective coating.

7. The package according to claim 1, further comprising:
at least one electrically-conductive vertical through-connection extending through the base body, and configured for electrically coupling the optical component with an environment of the hermetic package, wherein the at least one vertical through-connection is formed by an insulated-metal substrate.

8. The package according to claim 1, further comprising at least one of the following features:
at least one driver for driving the optical component, embedded in the hermetic package;
wherein the optical component is at least partially surrounded by or covered with a thermally highly-conductive coating;
wherein the optical component is mounted slanted on the base body so that a light-emitting direction of the optical component is oriented upwardly;
wherein at least a portion of a surrounding of the optical component consists of bulk metal; and
an inorganic cap body connected with the base body so that the optical component is enclosed between the cap body and the base body.

9. The package according to claim 1, wherein the organic material forms part of a component carrier comprising a stack formed of at least one electrically-conductive layer structure and/or at least one electrically-insulating layer structure.

10. The package according to claim 9, further comprising at least one of the following features:
wherein at least one of the at least one electrically-conductive layer structure comprises at least one of the group consisting of copper, aluminum, nickel, silver, gold, palladium, and tungsten;
wherein at least one of the at least one electrically-insulating layer structure comprises at least one of the group consisting of reinforced or non-reinforced resin, epoxy resin or Bismaleimide-Triazine resin, FR-4, FR-5, cyanate ester, polyphenylene derivate, glass, prepreg material, polyimide, polyamide, liquid-crystal polymer, epoxy-based build-up material, polytetrafluoroethylene, a ceramic, and a metal oxide;
wherein the component carrier is shaped as a plate;
wherein the component carrier is configured as one of the group consisting of a printed-circuit board, and a substrate, or a preform thereof; and
wherein the component carrier is configured as a laminate-type component carrier.

11. The hermetic package according to claim 1, wherein the inorganic inlay is completely surrounded by the base body.

12. A method of manufacturing a hermetic package, the method comprising:

providing a base body with a bottom made of an organic dielectric material, forming a cavity in the base body, wherein an inorganic inlay is adjacent to the cavity and surrounded by the base body by embedding the inorganic inlay at least partly in the base body made of the organic dielectric material;

mounting an optical component in the cavity of the base body; and wherein the optical component is hermetically enclosed along all surrounding sides by a continuous uninterrupted inorganic cage between the optical component and an exterior of the package, wherein the cage comprises the inorganic inlay which extends continuously across the cavity of the base body.

13. The method according to claim 12, further comprising at least one of the following steps:

connecting a cap with the base body so that the optical component is enclosed wherein connecting comprises at least one of the group consisting of sintering, soldering, welding, thermal-compression bonding, and glass sealing;

wherein the cavity is evacuated and/or filled with an inert gas; and forming an electrically conductive material by a chemical deposition.

* * * * *